US012184244B2

(12) United States Patent
Bameri et al.

(10) Patent No.: US 12,184,244 B2
(45) Date of Patent: Dec. 31, 2024

(54) MILLIMETER-WAVELENGTH POWER AMPLIFIERS HAVING BOTH HIGH POWER GAIN AND HIGH OUTPUT POWER

(71) Applicant: The Regents of the University of California, Oakland, CA (US)

(72) Inventors: Hadi Bameri, Davis, CA (US); Omeed Momeni, Davis, CA (US)

(*) Notice: Subject to any disclaimer, the term of this patent is extended or adjusted under 35 U.S.C. 154(b) by 674 days.

(21) Appl. No.: 17/369,879

(22) Filed: Jul. 7, 2021

(65) Prior Publication Data
US 2022/0014158 A1 Jan. 13, 2022

Related U.S. Application Data

(60) Provisional application No. 63/048,986, filed on Jul. 7, 2020.

(51) Int. Cl.
*H03F 3/21* (2006.01)
*H03F 1/22* (2006.01)

(52) U.S. Cl.
CPC ........ *H03F 3/211* (2013.01); *H03F 2200/451* (2013.01)

(58) Field of Classification Search
CPC .... H03F 3/211; H03F 2200/451; H03F 1/565; H03F 3/45183; H03F 1/223

USPC .......................................... 330/311, 277, 302
See application file for complete search history.

(56) References Cited

U.S. PATENT DOCUMENTS 8,446,217 B2 * 5/2013 Bagga ..................... H03F 1/347
330/195
2018/0062582 A1 * 3/2018 Pehlivanoglu .......... H03F 3/213

* cited by examiner

*Primary Examiner* — Hieu P Nguyen
(74) *Attorney, Agent, or Firm* — Park, Vaughan, Fleming & Dowler LLP

(57) ABSTRACT

A power amplifier (amp) is disclosed. This power amp can include a first transistor configured in the common source (CS) amplification mode, wherein the gate terminal of the first transistor is used as the input port of the power amp; and a second transistor configured in the common gate (CG) amplification mode, wherein the drain terminal of the second transistor is used as the output port of the power amp. The power amp also includes a first inductive component coupled between the drain terminal of the first transistor and the ground to increase the impedance between the drain terminal of the first transistor and the ground, thereby increasing an output power at the output port. The power amp additionally includes a second inductive component coupled between the drain terminal of the first transistor and the source terminal of the second transistor to increase the conductance in the output admittance at the output port, thereby further increasing the output power at the output port.

18 Claims, 23 Drawing Sheets

PROPOSED CASCODE AMP-CELL 710

SMALL-SIGNAL EQUIVALENT CIRCUIT OF PROPOSED AMP-CELL 710

EQUIVALENT CIRCUIT 1200 (FIG. 12A) AND SIMPLIFIED EQUIVALENT CIRCUIT 1202 (FIG. 12B) OF THE PROPOSED SPC 1000

| Reference | This work | [33] | [41] | [42] | [43] | [44] | [45] |
|---|---|---|---|---|---|---|---|
| Technology | 65nm CMOS | 65nm CMOS | 130nm BiCMOS | 130nm BiCMOS | 65nm CMOS | 65nm CMOS | 32nm SOI CMOS |
| $f_{max}$ (GHz) | 400 | 352 | 370 | 300 | 395 | 395 | 320 |
| 3dB Bandwidth (GHz) | 195-209 | 251-263 | 200-220 | 200-255 | 275-284 | 227.5-257.5 | 205-225 |
| Gain (dB) | 19.5 (22.5**) | 9.2 | 25 | 12.5 (15.5**) | 12 | 13.9 | 15** |
| OP1dB (dBm) | 6.3 (7.8*) | -8 | 4 | 9 (10.5**) | -5.9 | -5.1 | 2.7* |
| $P_{sat}$ (dBm) | 9.4 (10.9*) | -3.9 | 9.6 | 12 (13.5**) | -4.7 | -3.3 | 4.6* |
| PAE max (%) | 1.03 (1.4**) | 1.35 | 0.5 | 2.14(3**)² | 1.62 | 1.6 | 6** |
| $V_{DD}$ (V) | 2.4 | 1 | 3.3 | 3.3 | 0.85 | 0.85 | 1 |
| DC power (mW) | 732 | 27.6 | 1824¹ | 740 | 17.85 | 23.8 | 40 |
| Active area (mm²) | 0.92 (0.52***) | 0.14 | 0.84¹ | 0.83 | 0.056 | 0.053 | 0.06**** |
| FOM⁵ | 52.1 (57.9***) | 30 | 54 | 51 (55.5) | 33 | 36.4 | 50.6** |

PERFORMANCE COMPARISON TO STATE-OF-THE-ART.

FIG. 18

MILLIMETER-WAVELENGTH POWER AMPLIFIERS HAVING BOTH HIGH POWER GAIN AND HIGH OUTPUT POWER

CROSS-REFERENCE TO RELATED APPLICATION

This application claims the benefit of priority under 35 U.S.C. 119(e) to U.S. Provisional Patent Application Ser. No. 63/048,986, entitled "Embedded Power Amplifier," by inventors Hadi Bameri and Omeed Momeni, filed on 7 Jul. 2020, the contents of which are incorporated by reference herein.

GOVERNMENT LICENSE RIGHTS

This invention was made with U.S. government support under grant number 1611460 awarded by the National Science Foundation (NSF). The U.S. government has certain rights in the invention.

BACKGROUND

Field

The disclosed embodiments generally relate to the design of radio-frequency (RF) power amplifiers. More specifically, the disclosed embodiments relate to the design of a high output power and high power gain millimeter-wavelength power amplifier comprising cascaded amp-cells, wherein each of the amp-cells is implemented with a proposed matched-cascode design.

Related Art

Achieving relatively high maximum oscillation frequencies ($f_{max}$) has made CMOS technology a promising low-cost solution for implementing transceivers operating at the higher end of the millimeter-wavelength (mm-wave) band. However, the supported distances in radios are mainly limited by the output power of power amplifiers (PAs) in existing technology. Implementing high-power PAs at this frequency band is challenging mainly because the gain of the individual amplifying cells (amp-cells) can be critically low compared to the loss of matching networks used in conjunction with the amp-cells, making it extremely difficult to get close to the saturated output power ($P_{sat}$) of these amp-cells while achieving a useful gain.

High-voltage topologies such as cascode and stacked amp-cells are traditionally used to increase supply voltage so that the maximum output swing and hence the output power can be increased. However, conventional cascode amp-cells commonly suffer from large inter-cell parasitic capacitance and hence small gain at higher mm-wave frequencies. Power combining techniques, which mostly fall into series and parallel categories, can be used to raise the output power. However, the existing series type of power combiners suffers from imbalanced input impedances due to parasitic capacitors between the primary and secondary of the transformer and therefore, the output power and gain drop. The existing parallel type of power combiners increases the impedance transformation ratio and the loss of the output matching network, and thus decreases the output power and gain.

Hence, what is needed is a millimeter-wavelength power amplifier design that does not suffer from the above-mentioned drawbacks of existing designs.

SUMMARY

Various power amplifier (PA) designs are provided to simultaneously boost output power and power gain are described. A first proposed power amplifier uses a matched-cascode amp-cell to increase supply voltage and $P_{sat}$ while keeping the power gain of the amp-cell reasonably high. Another proposed power amplifier includes embedding around the proposed matched-cascode amp-cell to increase the output power of the PA and get closer to the $P_{sat}$ of the amp-cell by providing sufficient gain. To further increase the output power and alleviate output impedance matching of the PA, a differential slot power combiner/divider is proposed to be implemented at the outputs, the inputs, or both the outputs and the inputs of two differential channels of PA chains. Various embodiments also provide a matched-cascode amp-cell design configured to deliver higher output signals at a higher signal gain at high mm-wave frequencies compared to a traditional cascode amp-cell.

In one aspect, a new cascode amp-cell that can achieve both increased the output power and boosted power gain is disclosed. This cascode amp-cell can include a first transistor configured in the common source (CS) amplification mode, wherein the gate terminal of the first transistor is used as the input port of the cascode amp-cell; and a second transistor configured in the common gate (CG) amplification mode, wherein the drain terminal of the second transistor is used as the output port of the cascode amp-cell. The cascode amp-cell also includes a first inductive component coupled between the drain terminal of the first transistor and the ground to increase the impedance between the drain terminal of the first transistor and the ground, thereby increasing an output signal and a signal gain at the output port. The cascode amp-cell additionally includes a second inductive component coupled between the drain terminal of the first transistor and the source terminal of the second transistor to increase the conductance in the output admittance at the output port, thereby further increasing an output signal at the output port.

In some embodiments, the first inductive component includes a first inductor implemented as a first transmission line.

In some embodiments, the first inductive component further includes a DC-blocking capacitor coupled in series with the first transmission line.

In some embodiments, the first inductive component is configured to resonate with a parasitic capacitance between the drain terminal of the first transistor and the ground at a millimeter-wavelength (mm-wave) frequency.

In some embodiments, the second inductive component is configured to maximize the conductance in the output admittance at the output port.

In some embodiments, the second inductive component is configured to increase the ratio of the resistance to the reactance in the impedance seen from the drain of the second transistor.

In some embodiments, the second inductive component includes a second transmission line.

In some embodiments, the second transmission line is configured to have a length between 0 and $\lambda/4$, wherein $\lambda$ is the electrical length associated with an operating frequency of the cascode amp-cell.

In some embodiments, the cascode amp-cell is configured as a power amplifier, and the first inductive component and the second inductive component are configured to increase a power transfer from the first transistor to the second transistor.

In some embodiments, the cascode amp-cell also includes an impedance-matching circuitry coupled to the input port of the cascode amp-cell to conjugate-match a source impedance of the cascode amp-cell to a load impedance of the cascode amp-cell.

In another aspect, a power amplifier (amp) is disclosed. This power amp can include a first transistor configured in the common source (CS) amplification mode, wherein the gate terminal of the first transistor is used as the input port of the power amp; and a second transistor configured in the common gate (CG) amplification mode, wherein the drain terminal of the second transistor is used as the output port of the power amp. The power amp also includes a first inductive component coupled between the drain terminal of the first transistor and the ground to increase the impedance between the drain terminal of the first transistor and the ground, thereby increasing an output power at the output port. The power amp additionally includes a second inductive component coupled between the drain terminal of the first transistor and the source terminal of the second transistor to increase the conductance in the output admittance at the output port, thereby further increasing the output power at the output port.

In some embodiments, the first inductive component includes a first inductor implemented as a first transmission line.

In some embodiments, the first inductive component further includes a DC-blocking capacitor coupled in series with the first transmission line In some embodiments, the first inductive component is configured to resonate with a parasitic capacitance between the drain terminal of the first transistor and the ground at a millimeter-wavelength (mm-wave) frequency.

In some embodiments, the second inductive component is configured to maximize the conductance in the output admittance at the output port.

In some embodiments, the second inductive component is configured to increase the ratio of the resistance to the reactance in the impedance seen from the drain of the second transistor.

In some embodiments, the second inductive component includes a second transmission line.

In some embodiments, the second transmission line is configured to have a length between 0 and $\lambda/4$, wherein $\lambda$ is the electrical length associated with an operating frequency of the power amp.

In some embodiments, the first inductive component and the second inductive component are configured to increase a power transfer ratio from the first transistor to the second transistor.

In some embodiments, the power amp also includes an impedance-matching circuitry coupled to the input port of the power amp to conjugate-match a source impedance of the power amp to a load impedance of the power amp.

In yet another aspect, an embedded amplifier-cell (amp-cell) is disclosed. This embedded amp-cell includes an input port and output port, and at least one transistor configured in an amplification mode and coupled between the input port and the output port. This embedded amp-cell also includes a series-embedding circuitry coupled to both the input port and output port, wherein the series-embedding circuitry is tuned to preset a direction of movement of the embedded amp-cell in a gain plane to a desired location in the gain plane. The embedded amp-cell additionally includes a parallel-embedding circuitry coupled between the input port and output port, wherein the parallel-embedding circuitry is tuned to obtain both a desired output power and the desired power gain at the output port.

In some embodiments, the series-embedding circuitry includes a first passive element coupled in series to the input port and a second passive element coupled in series to the output port.

In some embodiments, the first passive element includes a first inductor and the second passive element includes a second inductor, wherein both the first and second inductors are implemented as transmission lines.

In some embodiments, tuning the series-embedding circuitry includes presetting the direction of movement of an operation point of the embedded amp-cell from a current location in a gain plane toward a desired location in the gain plane, wherein the desired location is associated with a desired output power and a desired power gain.

In some embodiments, tuning the parallel-embedding circuitry includes moving the operation point of the embedded amp-cell from the current location in the gain plane to the desired location along the preset direction of movement.

In some embodiments, the desired location in the gain plane is an intersect between a first equi-$G_{ma}$ contour in a set of equi-$G_{ma}$ contours and a first equi-$G_L$ contour in a set of equi-$G_L$ contours, and wherein $G_{ma}$ is the maximum available power gain and $G_L$ is the conductance of simultaneously-matched load admittance.

In some embodiments, the parallel-embedding circuitry includes at least one passive element. In some embodiments, the at least one passive element is an inductor.

In some embodiments, the parallel-embedding circuitry is configured to feed back a fraction of the output power of the embedded amp-cell into the input port to obtain a gain boosting in the embedded power amp-cell.

In some embodiments, the parallel-embedding circuitry includes: a first transmission line element; a second transmission line elements coupled in series with the first transmission line element; a DC decoupling capacitor coupled between the first transmission line element and the second transmission line element.

In still another aspect, a process for designing a high output power and high power gain power amplifier is disclosed. This process can start by receiving a non-embedded amplifier, wherein the non-embedded amplifier includes an input port and an output port. The process then computes a first location of the non-embedded amplifier within a gain plane. Next, the process chooses a target location in the gain plane for the non-embedded amplifier, wherein the target location is associated with a desired output power and a desired power gain for the amplifier. Next, the process pre-embeds the non-embedded amplifier with a series-embedding circuitry, wherein the series-embedding circuitry is tuned to preset a direction of movement of the amplifier in the gain-plane based on the first location and the target location. The process further embeds the pre-embedded amplifier with a parallel-embedding circuitry, wherein parallel-embedding circuitry is tuned so that the pre-embedded amplifier moves from the original location to the target location along the preset direction.

In some embodiments, the process computes the first location of the non-embedded amplifier in the gain plane by using the Y-parameters of the amplifier.

In some embodiments, the gain plane includes a set of equi-$G_{ma}$ contours and a set of equi-$G_L$ contours, and $G_{ma}$ is the maximum available power gain and $G_L$ is the conductance of simultaneously-matched load admittance.

In some embodiments, the process chooses the target location in the gain plane by identifying an intersect between a first equi-$G_{ma}$ contour in the set of equi-$G_{ma}$ contours and a first equi-$G_L$ contour in the set of equi-$G_L$ contours.

In some embodiments, the process further includes pre-generating the set of equi-$G_{ma}$ contours and the set of equi-$G_L$ contours for the amplifier by computing a large number of $G_{ma}$ and $G_L$ values in the gain plane based on a large number of embedded configurations of the amplifier.

In some embodiments, the series-embedding circuitry includes a first transmission line coupled in series to the input port and a second transmission line coupled in series to the output port.

In some embodiments, the parallel-embedding circuitry includes a third transmission line coupled between the input port and the output port.

In some embodiments, the parallel-embedding circuitry further includes a four transmission line coupled in series with the third transmission line and a DC decoupling capacitor coupled between the third transmission line and the fourth transmission line.

In some embodiments, the parallel-embedding circuitry is configured to feed back a fraction of the output power from the output port to the input port to obtain a gain boosting in the embedded amplifier.

In still another aspect, a slot power combiner is disclosed. This slot power combiner includes: an input microstrip implemented as a first metal trace, wherein each end of the input microstrip is configured as an input port to receive one of two out-of-phase input power signals; an output microstrip implemented as a second metal trace, wherein one end of the output microstrip is configured as an output port to output a combined power signal of the two out-of-phase input power signals; and a slotline positioned perpendicular to and overlapping both the input microstrip and the output microstrip, wherein the slotline is configured to transport the combined power signal of the two out-of-phase input power signals from the input microstrip to the output microstrip.

In some embodiments, the slotline is etched into a metal layer such as the ground plane In some embodiments, the input microstrip is made in a first metal layer, and the output microstrip is made in a second metal layer.

In some embodiments, the input microstrip and the output microstrip are electrically decoupled from each other.

In some embodiments, the input microstrip and the output microstrip do not overlap in the horizontal plane.

In some embodiments, the slot power combiner is used as a slot power divider to divide a single channel of input power signal into two channels of output power signals.

DESCRIPTION OF THE FIGURES

FIG. 18 shows the summary of an exemplary implementation of the proposed power amplifier performance compared to state-of-the-art PA designs in accordance with some embodiments.

DETAILED DESCRIPTION

Figure 1A:
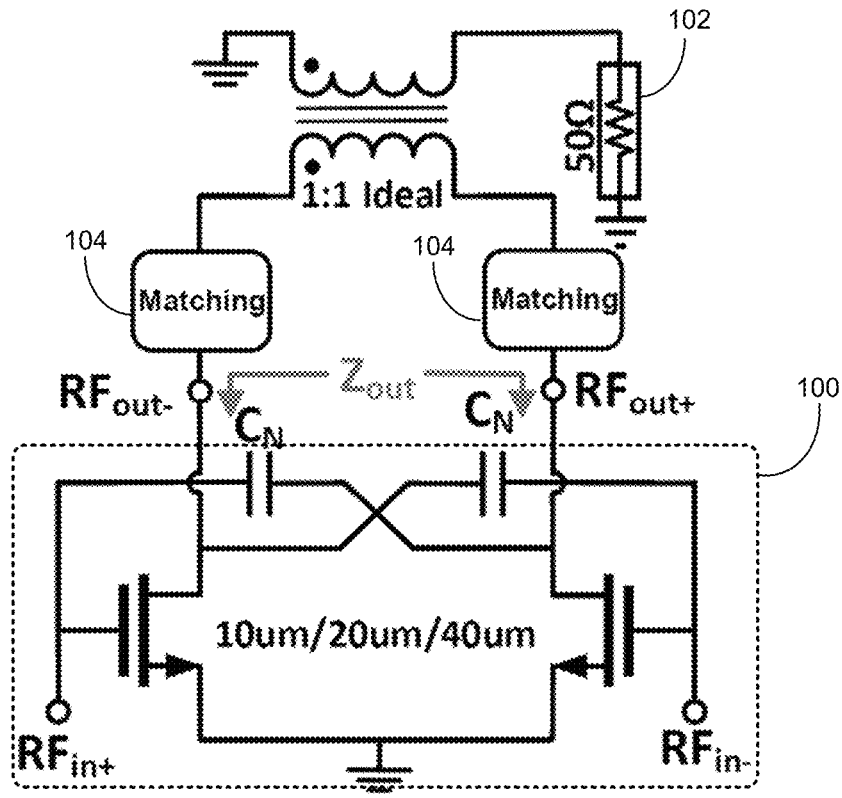
FIG. 1A shows an N-type metal-oxide-semiconductor (NMOS) common-source differential amplifier neutralized by two capacitors $C_N$.

The following description is presented to enable any person skilled in the art to make and use the disclosed embodiments, and is provided in the context of one or more particular applications and their requirements. Various modifications to the disclosed embodiments will be readily apparent to those skilled in the art, and the general principles defined herein may be applied to other embodiments and applications without departing from the scope of those that are disclosed. Thus, the present invention or inventions are not intended to be limited to the embodiments shown, but rather are to be accorded the widest scope consistent with the disclosure.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Gain Impact on Output Power of PAs at Near-$f_{max}$ Frequencies

Generally speaking, as operating frequency increases, loss mechanisms in both active and passive components within a power amplifier (PA) start to dominate the performance of the PA. More specifically, in the passive components, such as those passive components in the matching networks, losses in metals increase proportional to the square-root of the frequency primarily due to the skin effect. Moreover, dielectric substrates of the passive components become more lossy, because dielectric loss tangent increases proportional to the frequency. These effects can result in low quality factor of the passive components that adversely affects the gain of the PA, primarily from those passive components in the matching networks (see FIG. 1A below). On the other hand, internal losses of the active components such as transistors reduce maximum available power gain as frequency increases, such that beyond the maximum oscillation frequency ($f_{max}$) these components are no longer considered active. These loss factors when combined, make the design of PAs challenging or even impossible at near-$f_{max}$ frequencies. In addition to the above-described challenges associated with small-signal amplifier design at near-$f_{max}$ PAs can also suffer from low input/output impedances which further increases matching loss.

FIG. 1A shows an N-type metal-oxide-semiconductor (NMOS) common-source differential amplifier 100 neutralized by two capacitors $C_N$. As shown in FIG. 1A, differential amplifier 100 includes two NMOS transistors for three selected transistor sizes: 10 um, 20 um, and 40 um in a 65 nm CMOS process and a pair of cross-coupled neutralization capacitors $C_N$. Moreover, the differential output ($RF_{out+}$-$RF_{out-}$) of differential amplifier 100 is matched to a 50Ω load 102 using an L-matching network 104 for the three selected transistor sizes. In the particular design, the quality factors of the inductor and the capacitor in the L-matching network 104 are selected to be constant with frequency, i.e., 20 and 8, respectively.

Figure 1B:
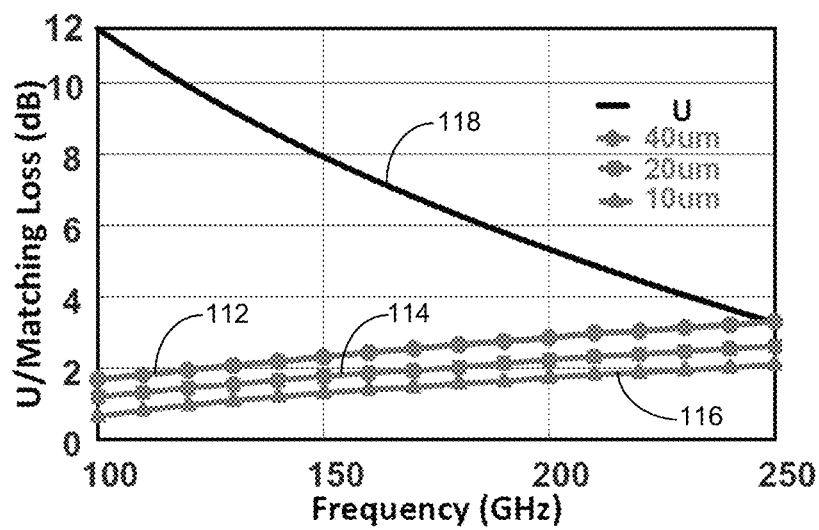
FIG. 1B shows a set of matching loss versus (vs.) frequency curves for three selected transistor sizes as well as unilateral power gain vs. frequency curve for all three transistor sizes.

FIG. 1B shows a set of matching loss versus (vs.) frequency curves 112, 114, and 116 for the three selected transistor sizes: 40 um, 20 um, and 10 um, respectively, as well as an unilateral power gain (U) vs. frequency curve 118 of a 10 um NMOS transistor. Note that we can reasonably assume that U vs. frequency responses for 20 um and 40 um NMOS transistors to be the same as the U vs. frequency curve for 10 um NMOS transistor because the metal connections that are used to make 10 um transistors in parallel in order to make 20 um and 40 um transistors are very short and hence have very low loss. As described above, the matching loss is mainly associated with the passive components in L-matching network 104. As it can be seen in FIG. 1B, U becomes smaller than the matching loss at frequencies higher than 250 GHz for 40 um transistor size. This means that, to use differential amplifier 100 as an amplifying cell (or "amp-cell" hereinafter) in a PA, a designer needs to either reduce the transistor size in differential amplifier 100 or reduce the operating frequency. In reality, quality factors of the matching network elements are not constant but decrease with the operating frequency, thereby making the design of high gain PAs with larger transistors at high frequencies even more complex.

Note that the rise in losses at high operating frequencies not only reduces overall small-signal gain of a PA, but also adversely affects the output power of a PA. Because the available gain from amp-cells at high millimeter (mm)-wave frequency band is small, multiple amp-cells coupled in series in a chain, or in a "cascade" configuration are typically required to achieve a reasonable gain. In a typical cascaded PA design, those amp-cells located close to the input of the PA, also referred to as "the driver stages," "the driver amp-cells," or simply "the drivers," are specifically used to increase the small signal gain. Each additional amp-cell added after the drivers needs to be configured to deliver higher power to the load of the PA than its preceding amp-cell, while increasing the overall power gain of the PA. Hence, these additional amp-cells form a chain of power amplification stages or "amplification stages." In practice, an amplification stage is often referred to as the combination of an amp-cell and a matching network preceding that amp-cell.

Figure 2A:
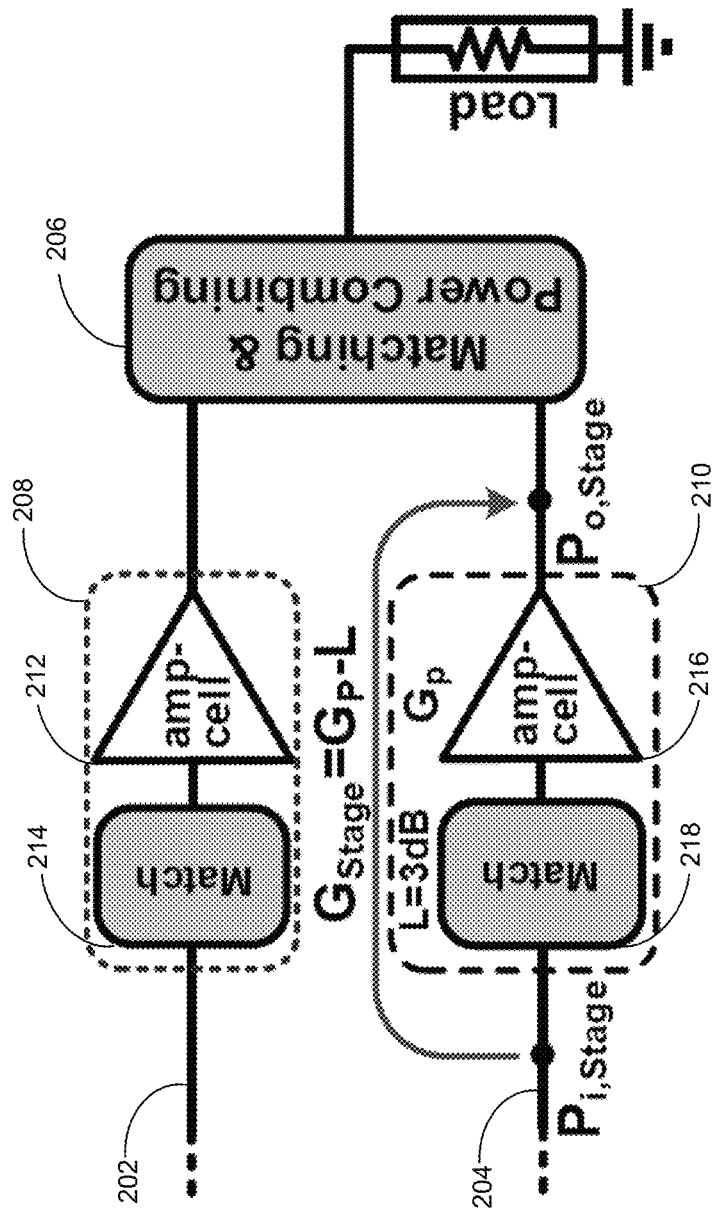
FIG. 2A shows a block diagram of a two-channel PA including two cascaded amplification chains and a power combining block coupled between the amplification chains and the load.

For example, FIG. 2A shows a block diagram of a two-channel PA 200 including two cascaded amplification chains 202 and 204 and a power combining block 206 coupled between the amplification chains and the load. Note that for each amplification chain 202 or 204, only the last amplification stage 208 or 210 in the respective amplification chain is explicitly shown. As can be seen in FIG. 2A, amplification stage 208 which is placed at the end of the amplification chain 202, includes an amp-cell 212 and its preceding matching network 214. Similarly, amplification stage 210 which is placed at end of the amplification chain 204, includes an amp-cell 216 and its preceding matching network 218.

Figure 2B:
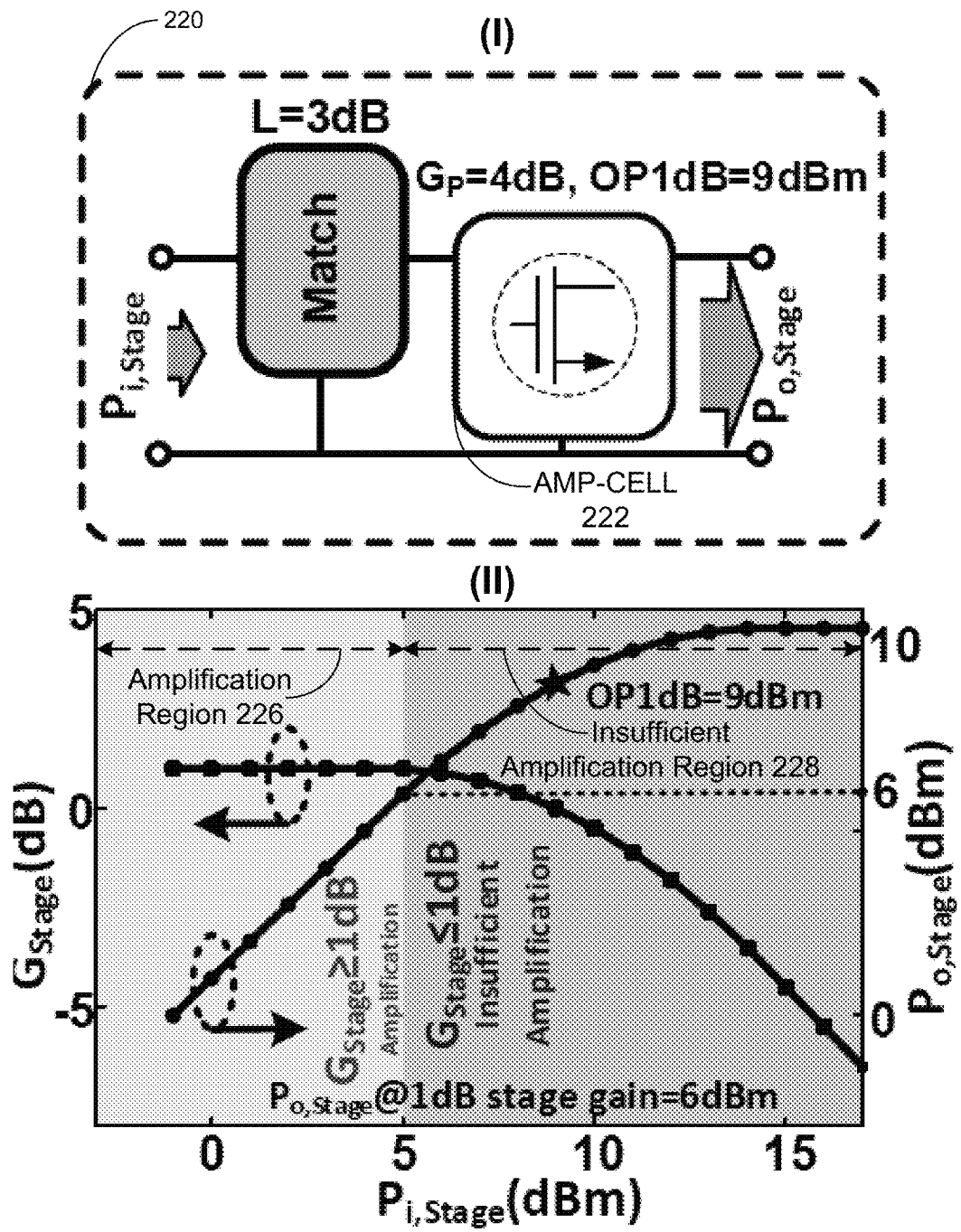
FIG. 2B shows (I) a block diagram of a matched-cascode stage including a high-power, low-gain amp-cell; and (II) a performance plot of the simulated gain and power of matched-cascode stage.

Having the practical aspect of the PA in mind, we can evaluate the highest output power of this stage at the point that the gain of the stage is compressed to the minimum gain of 1 dB. This ensures that the PA has an acceptable power gain when the highest power is being delivered by this PA. In other words, a PA stage with less than 1 dB gain is generally considered to be not useful even if that PA can deliver high output power. FIG. 2B shows (I) a block diagram of a matched-cascode stage 220 including a high-power, low-gain amp-cell 222; and (II) a performance plot of the simulated gain and power of matched-cascode stage 220. In the specific design of matched-cascode stage 220, amp-cell 222 has a power gain of 4 dB. Assuming the loss of the matching network 224 in stage 220 to be 3 dB, stage 220 then has a small-signal power gain of 1 dB. As shown in FIG. 2B, because the small-signal power gain of matched-cascode stage 220 is already 1 dB, no further gain compression is acceptable. As a result, the maximum output power $P_{o,Stage}$ of stage 220 delivered to the load is 6 dBm with respect to an input power of $P_{o,Stage}$=5 dBm, immediately before the stage gain compression starts.

Note that even though the amp-cell 222 has 1 dB output compression point (OP1 dB) of 9 dBm, and $P_{sat}$ of 11 dBm, matched-cascode stage 220 can at best deliver 6 dBm output power at 1 dB stage gain, well below the OP1 dB and $P_{sat}$ of amp-cell 222. This shows that even though the amp-cell 222 can have a high $P_{sat}$, the overall low small-signal stage gain of matched-cascode stage 220 limits the maximum power that can be delivered by amp-cell 222 when an acceptable gain of 1 dB is required. As can be further observed in the performance plot (II) in FIG. 2B, the input power range that corresponds to >1 dB stage gains is referred to as the "Amplification" region 226; whereas the input power range that corresponds to <1 dB stage gains is referred to as the "Insufficient Amplification" region 228. We will demonstrate below that, the high power capability of amp-cell 222 can be exploited to boost the small-signal power gain of stage 220, and extend the Amplification region 226 to higher input powers $P_{i,Stage}$, and as a result, achieving higher output power $P_{o,Stage}$ at 1 dB stage gain.

Figure 3A:
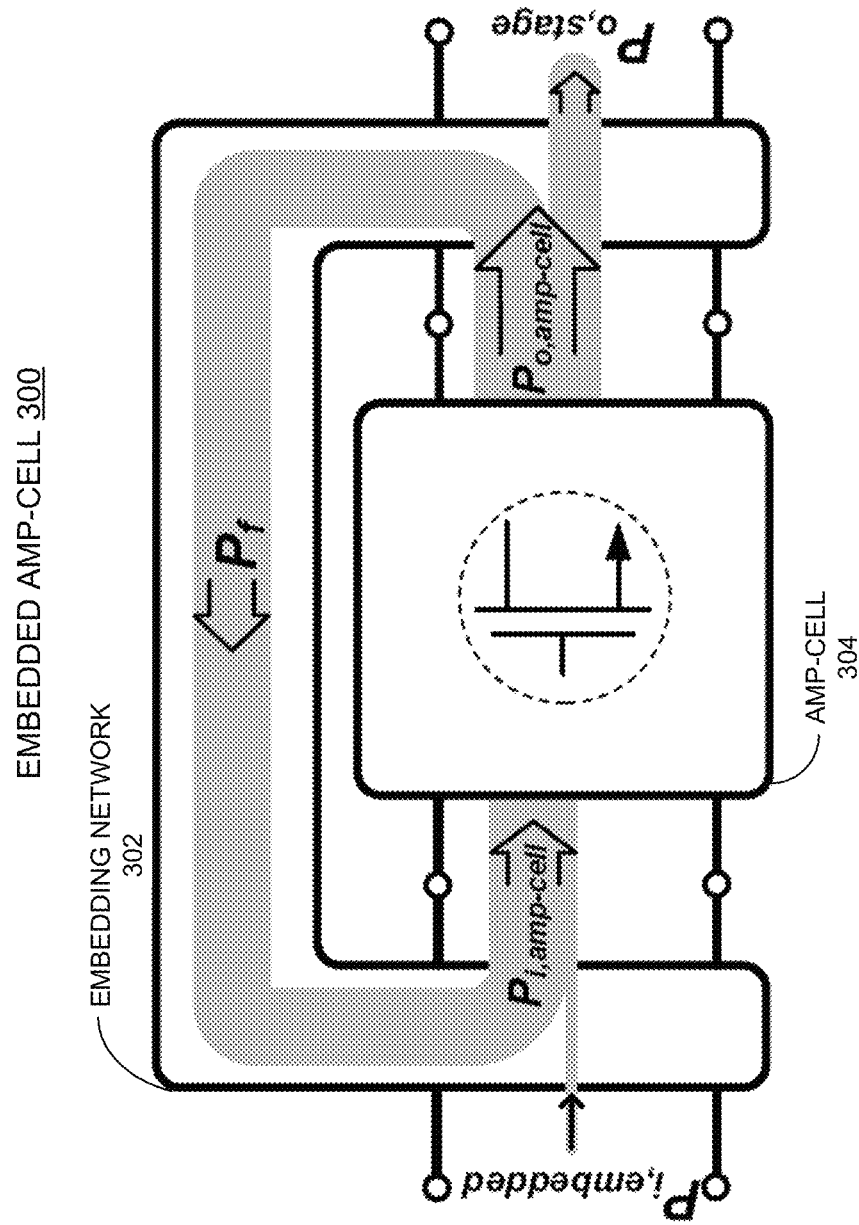
FIG. 3A shows a gain-boosting technique using embedding on the output power of a PA.

FIG. 3A shows a gain-boosting technique using an embedding network 302 on the output power of an embedded amp-cell 300. As can be seen in FIG. 3A, a small fraction of the output power from an amp-cell 304 is fed back to an input port of the amp-cell using a feedback circuitry, referred to as "embedding network" 302 to boost the power gain of the amp-cell 304. Note that this embedding network, i.e., the feedback circuitry can be coupled between an output port of amp-cell 304 and an input port of amp-cell 304. To simulate this feedback/embedding mechanism using a numerical simulator (e.g., Matlab®), a constant fraction of the output power of amp-cell 304 is extracted and fed back to its input to emulate the operation of a lossless embedding. Moreover, the feedback power is constructively added to the input power of amp-cell 304 to in order boost its power gain.

Figure 3B:
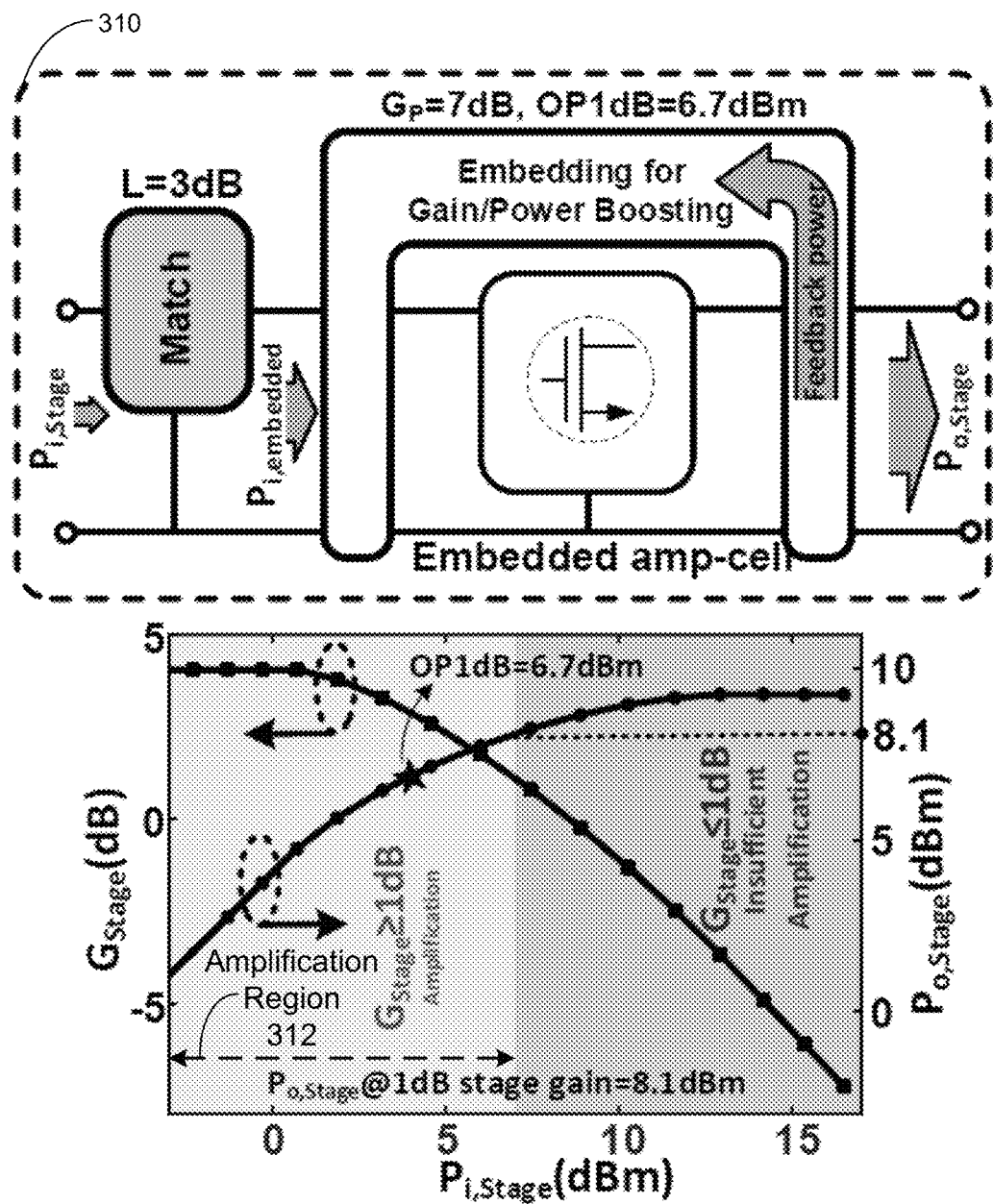
FIG. 3B shows the simulated performance of a matched-cascode amp-cell after using the embedding technique in the matched-cascode amp-cell.

FIG. 3B shows the simulated performance of a matched-cascode amp-cell 310 after using an embedding network in the matched-cascode amp-cell. The numerical simulation shows that, although the embedding, i.e., the output power feedback reduces OP1 dB and $P_{sat}$ of the embedded amp-cell 310 to 6.7 dBm, and 9.05 dBm, respectively, compared to the non-embedded amp-cell 220, the embedding technique has increased the small-signal power gain of the embedded amp-cell 310 to 4 dB even after factoring the matching loss of 3 dB. This boost in the small-signal stage gain translates to 3 dB gain compression at 1 dB stage-gain. As a result, the Amplification Region 312 is increased to 7.1 dBm of input power $P_{i,Stage}$ as compared to only 5 dBm in the non-embedded design shown in FIG. 2B. Moreover, the output power of embedded amp-cell 310 is also increased from 6 dBm to 8.1 dBm at the same 1 dB stage gain compared to the non-embedded amp-cell shown in FIG. 2B. FIG. 3B also shows that although the OP1 dB has dropped somewhat, the output power at 1 dB stage gain is well above the OP1 dB of 6 dBm. This analysis shows that using a power feedback/embedding network can not only boost the small-signal power gain of a PA, but also improve the output power of the PA at a specific power gain.

Output Power in Embedded Amplifiers

We have described above the effect of power gain on the output power of a PA by ideally subtracting a fraction of the signal power from the PA output and constructively adding the feedback power to an input port of the PA. In an actual circuit implementation however, the power feedback operation is typically performed by a passive network comprised of passive circuit elements. As a result, even though the stage gain can be boosted, the power delivery capability of the stage can also be adversely affected. This is because the feedback network can directly influence the impedances that are seen by the embedded amp-cell.

Because the gain boosting effect is generally calculated using small-signal analysis, to determine the relationship between the stage gain and output power of an embedded amp-cell and to simultaneously optimize both of these performance criteria, small-signal parameters need to be used to estimate the maximum linear output power. In some embodiments, an embedded amp-cell small-signal analysis can be performed by using an amp-cell configured in a T-embedding setup. Note that the T-embedding technique and analysis are described in "*A High-Gain mm-Wave Amplifier Design: An Analytical Approach to Power Gain Boosting*," by H. Bameri and O. Momeni, published in IEEE Journal of Solid-State Circuits, vol. 52, no. 2, pp. 357-370, February 2017 (also referred to as "Reference A" hereinafter), the content of which is incorporated herein by reference.

Figure 4:
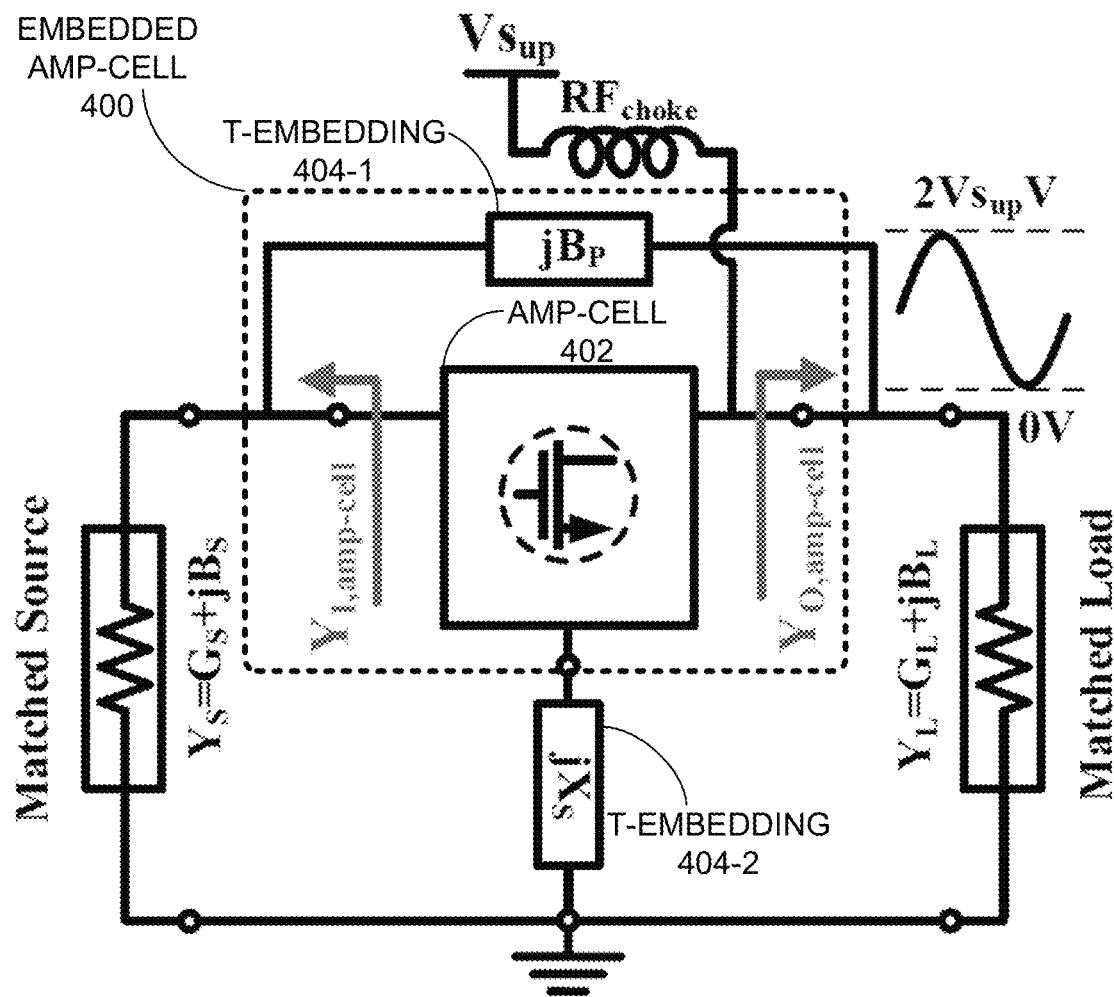
FIG. 4 shows an embedded amp-cell comprising a non-embedded amp-cell and a T-embedding network, and receiving a supply power through an RF choke inductor $RF_{choke}$ in accordance with some embodiments.

FIG. 4 shows an embedded amp-cell 400 comprising a non-embedded amp-cell 402 and an aforementioned T-embedding network 404 and receiving a supply power through an RF choke inductor $RF_{choke}$ in accordance with some embodiments. More specifically, T-embedding network 404 is composed of a first passive element 404-1 having an admittance $jB_p$ coupled between the input and output terminals of non-embedded amp-cell 402, and a first passive element 404-2 having an impedance $jX_s$ coupled in series with the common terminal of non-embedded amp-cell 402, hence the name of "T"-embedding.

Note that to conserve the hard-earned power-gain, it is assumed that in the T-embedding setup of FIG. 4 the embedded amp-cell 400 is conjugate-matched to both the source and load impedances. To simplify the power analysis, we assume that the output voltage of the embedded amp-cell 400 experiences clipping before its input voltage (which is consistent with the operation of regular power amplifiers), and also assume that this clipping is the only nonlinear effect that causes gain compression. Hence, the maximum linear output power $P_{o,max}$ of the embedded amp-cell 400 shown in FIG. 4 can be estimated as:

$$P_{o,max} = 0.5 V_{Sup}^2 \cdot G_L, \quad (1)$$

wherein $V_{Sup}$ is the supply voltage to amp-cell 402 and $G_L$ is the conductance of the simultaneously-matched load admittance $Y_{o,amp-cell}$. Note that embedding in an amp-cell generally functions as a feedback network, and as such the embedding alters the admittances seen from the input and output ports of embedded amp-cell 400 (i.e., $G_S$ and $G_L$ in FIG. 4, respectively).

Because $V_{Sup}$ does not change with embedding, and appreciating that the load pull would decrease the power gain of embedded amp-cell 400, thereby compromising its output power under a minimum acceptable gain, the maximum output power of embedded amp-cell 400 can be estimated based on $G_L$. Assuming the harmonic distortion is low at the maximum linear output power, the maximum linear output power could be used as an acceptable estimation and starting point for achieving the maximum output power. After finding the optimal embedding parameters based on the linear output power estimation, one can further improve the output power of embedded amp-cell 400 by simulating the large-signal performance of the embedded amp-cell and tuning the embedding even further. By changing the impedances seen by amp-cell 402, T-embedding 404 can increase or decrease the output power of amp-cell 402. Note that if T-embedding 404 can be configured such that the output power of amp-cell 400 increases at a higher rate than the increase in the feedback power (e.g., $P_f$ in FIG. 3A)), such an embedding 404 can simultaneously boost both the power gain and the output power of the embedded amp-cell 400.

Figure 5:
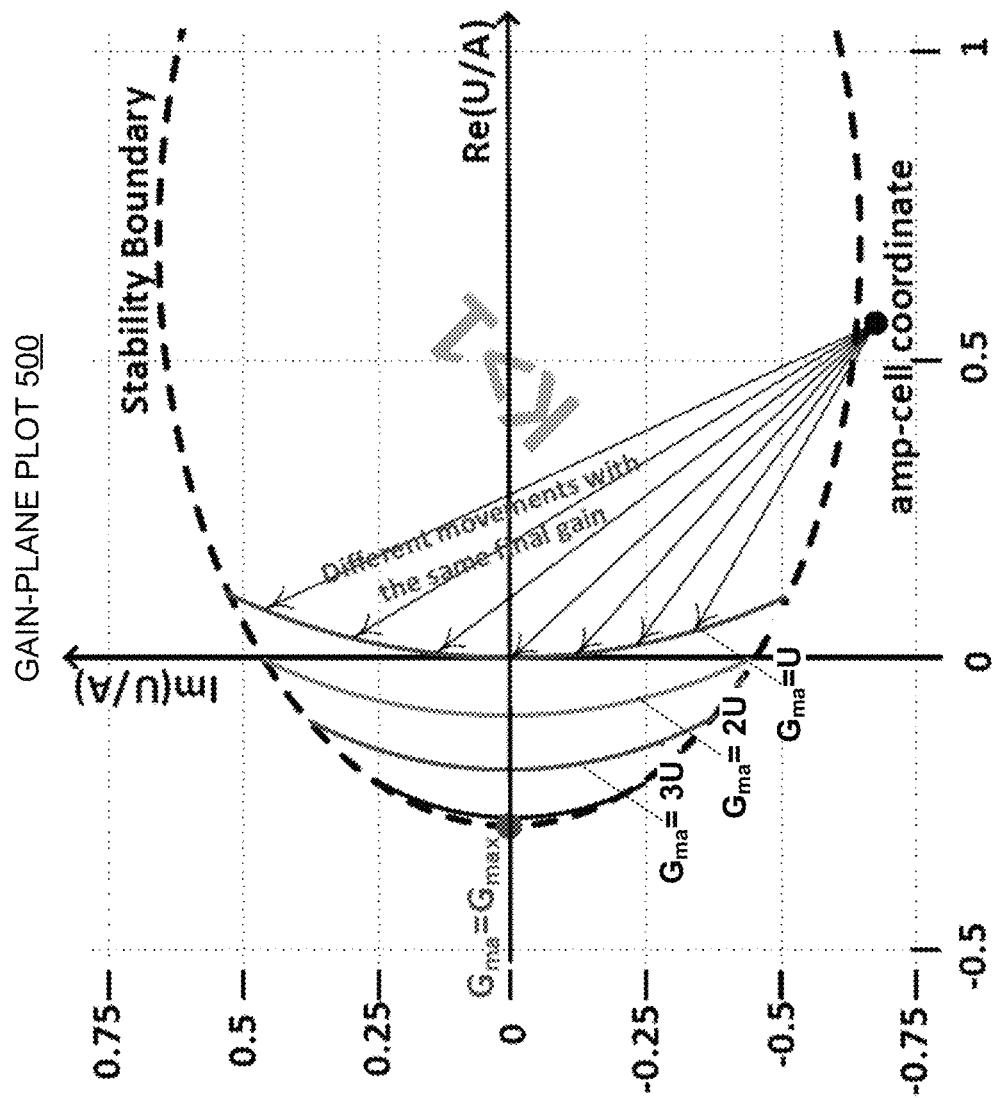
FIG. 5 shows a gain-plane plot and a set of movements of an amp-cell on an equi-gain contour $G_{ma}=U$ caused by different embedding configurations of the amp-cell to obtain the same boosted power gain in accordance with some embodiments.

There are a number of T-embedding networks which can be used to boost power gain of an amp-cell to a certain value, each of these embedding configurations generally results in a different $G_L$, and thus a different output power. In some embodiments, a gain-plane technique can be utilized to find a desired T-embedding network to simultaneously boost both the power gain and maximize the output power of the embedded amp-cell 400. FIG. 5 shows a gain-plane plot 500 and a set of movements of an amp-cell on equi-gain arc/contour $G_{ma}=U$ caused by different embedding configurations of the amp-cell to obtain the same boosted power gain in accordance with some embodiments. As can be seen in FIG. 5, gain-plane plot 500 includes a group of equi-gain arcs/contours (i.e., partial circles) in a plane having the horizontal axis of Re(U/A) and vertical axis of Im(U/A), wherein U is the Unilateral Power Gain and $A=Y_{21}/Y_{12}$ which is also referred to as the complex measure of non-reciprocity. This 2D coordinate system is referred to as the "gain-plane." Note that each of the set arcs/contours in the gain plane has a center at $((U/G_{ma}), 0)$ and a radius of $\sqrt{U/G_{ma}}$. The arcs/contours ("contours" hereinafter") that are shown in FIG. 5 correspond to equi-gain circles $G_{ma}=U$, 2U, and 3U, etc. Consequently, the value of U is constant on each of these contours, which are referred to as "equi-gain contours" hereinafter.

Using the gain-plane technique illustrated in FIG. 5, it can be shown that the power gain of an arbitrary amp-cell can be boosted to U by different movements (e.g., through different embeddings) of the amp-cell to different coordinates on the U circle (i.e., the $G_{ma}=U$ contour in FIG. 5) (see Reference A). Although all these movements result in the same power gain of U as shown on the $G_{ma}=U$ arc in FIG. 5, each of these movements is typically associated with a different set of passive elements 404-1 and 404-2 (i.e., $jB_P$ and $jX_S$) to achieve the gain boosting (see Reference A). This means that each movement results in a different $G_L$ and hence the maximum linear output power of the associated embedded amp-cell would not be the same for the set of movements on $G_{ma}=U$ contour.

In Reference A, the equations of parallel and series embeddings ($jB_P$ and $jX_S$)) have been derived to cause the movements substantially along the horizontal axis Re(U/A) to obtain a desired power gain, for the reasons of maximize the stability margins and simplifying the derivation. However, moving to a coordinate on the Re(U/A) axis for a desired gain does not necessarily result in the maximum output power. In some embodiments, to find the optimal embedding configuration that can achieve the maximum output power of the embedded amplifier, the equations used to calculate $X_S$ and $B_P$ are generalized to cover the entire stable region of K>1, wherein K is the stability factor of the embedded amplifier. The generalized equations for $X_S$ and $B_P$ and the descriptions are given in Appendix A, the content of which is incorporated herein by reference. In some embodiments, given the desired gain $G_{ma}$ and the desired location on the equi-$G_{ma}$ contour (or the desired coordinates in the gain-plane), the desired values of the passive components $B_{TP}$ and $X_{TS}$ in the T-embedding can be determined using the equations in Appendix A. Moreover, the equations in Appendix A can facilitate quickly and efficiently optimizing the embedding network 404 for a desired gain value.

Figure 6:
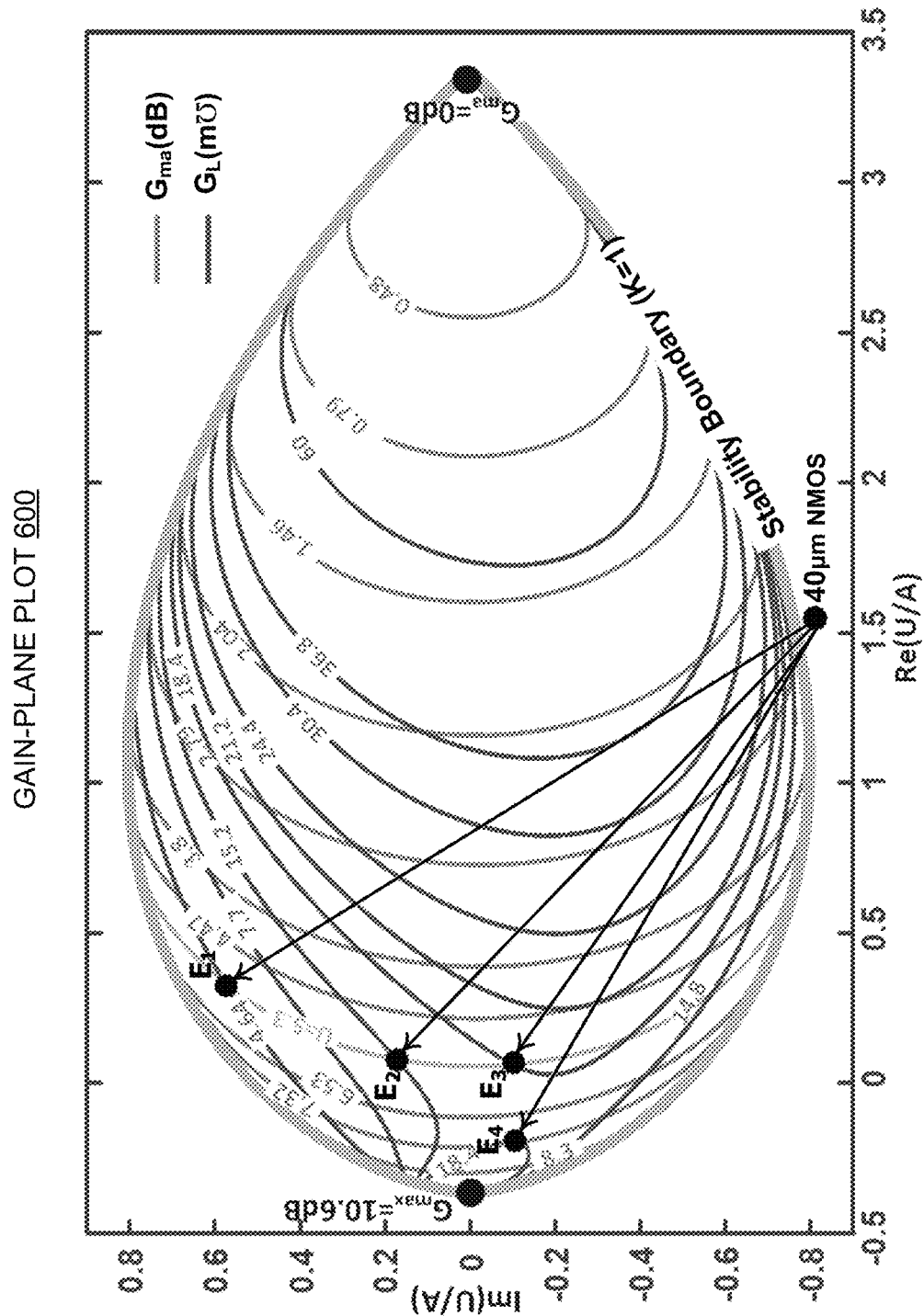
FIG. 6 shows a gain-plane plot comprising a set of equi-$G_{ma}$ contours and a set of equi-$G_L$ contours inside the stability boundary of K=1 for a 40 μm NMOS in 65 nm CMOS process embedded by T-embedding at 200 GHz in accordance with some embodiments.

Note that using the above-described gain plane technique, for a specific amp-cell, $G_L$ in Eqn. 1 can also be determined for each movement of the specific amp-cell in the gain plane. FIG. 6 shows a gain-plane plot 600 comprising a set of equi-$G_{ma}$ contours (i.e., the set of lighter curves that do not intersect each other) and a set of equi-$G_L$ contours (the set of darker curves that do not intersect each other) inside the stability boundary of K=1 for a 40 µm common-source NMOS in 65 nm CMOS process embedded by T-embedding at 200 GHz in accordance with some embodiments. Again, $G_{ma}$ is the maximum available power gain whereas $G_L$ is the conductance of the simultaneously-matched load admittance. Note that contours in the set of equi-$G_{ma}$ contours do not intersect each other, and the same is true for the set of equi-$G_L$ contours. However, the set of equi-$G_{ma}$ contours do interest with the set of equi-$G_L$ contours, wherein the these intersects can be used to find the desired embedded amp-cell designs.

In some embodiments, the set of equi-$G_{ma}$ contours and the set of equi-$G_L$ contours in FIG. 6 can be generated using the equations in Appendix A. More specifically, to generate the contours in FIG. 6, we can first select a rectangular box that is sufficiently large to enclose the entire stable region in the gain plane. Note that the boundaries of the initially-selected box can be changed if in the subsequent simulation steps it is found out that the box does cover the entire stable region of K>1. Next, the rectangular region can be divided to a two-dimensional (2D) array of small pixels. Using the equations shown in Appendix A, a large number of embedding networks are calculated so that they can be used to move the amp-cell to all of these pixels. With the known values of the embedding networks, K, $G_{ma}$, and $G_L$ values associated with each of these embedding networks can be calculated for the array of pixels. Next, the stable region that corresponds to K≥1 can be determined based on the calculated K values and a proper numerical technique. Finally, the equi-$G_{ma}$ and equi-$G_L$ contours within the determined stable region can be plotted numerically based on the calculated $G_{ma}$ and $G_L$ values.

Note that it can be clearly observed from FIG. 6 that different coordinates/locations on a given equi-$G_{ma}$ contour in gain-plane plot 600 can be associated with different $G_L$ values (i.e., by intersecting multiple equi-$G_L$ contours), resulting in different output powers. For example, if a design selects to boost the power gain to U, a movement to coordinates $E_1$ on $G_{ma}$=U contour would result in $G_L$=4.64 MΩ (by intersecting $G_L$=4.64 MΩ contour). For a supply $V_{Sup}$=1V, this design translates to a maximum output power of $P_{o,max}$=3.65 dBm. However, for the same power gain of U, the amp-cell can be embedded to move to coordinates $E_2$ or $E_2$ on the same $G_{ma}$=U contour. As can be observed in gain-plane plot 600, $E_2$ and $E_3$ correspond to the $G_L$ values of 15.2 MΩ and 18.4 MΩ, respectively, resulting in 8.8 dBm and 9.6 dBm output power, respectively. These two power levels are significantly higher than the power level corresponding to $E_1$. Moreover, $E_2$ and $E_3$ are positioned much further away from the stability boundary K=1 compared to $E_1$ and therefore represent much more reliable operating points.

FIG. 6 also shows that the embedding configuration that moves the transistor to coordinates $E_4$ not only results in a higher gain of 7.3 dB, but a higher output power of 6 dBm, compared to the corresponding values associated with $E_1$. Intuitively, the above observation can be explained as follows. To boost the power gain to higher values, the embedding network has to feed a larger fraction of the output power back to the input of the amp-cell. At the same time, the embedding network is also changing the conductance seen by the amp-cell, real($Y_{O,amp-cell}$). In other words, in the case of $E_4$, the associated embedding is boosting the gain by feeding back more power but at the same time also increasing the output power of the amp-cell at an even higher rate than the rate of power extraction by increasing real ($Y_{O,amp-cell}$).

Note that while the above analysis based on the gain-plane plot of FIG. 6 is for a single CMOS transistor amp-cell embedded by a T-embedding, the general analytic procedure based on using equi-$G_{ma}$ and equi-$G_L$ contours can be applied to any amp-cell design embedded by a T-embedding network to achieve a combination of high power gain and high output power. It should be noted that if other types of embeddings instead of the T-embedding are to be used to move a given amp-cell to the same exemplary coordinates, such as $E_2$ or $E_3$ in FIG. 6, the same U/A values can correspond to a set of $G_L$ values different from those shown in FIG. 6. In some embodiments, $G_L$ values can be determined as the real part of simultaneously-matched output admittance.

High Power Amp-Cell Design

As FIG. 3A suggests, output power of an embedded power amplifier is a direct function of the amp-cell's output power. To enhance output power of a single-transistor amp-cell (e.g., an amp-cell configured in a common-source (CS) topology), one can increase the size of the transistor. However, a large transistor typically has low input/output impedances, and consequently high matching loss and low gain of the amp-cell. The above limitations limit the maximum transistor size that can be used to achieve an acceptable stage gain and output power at high mm-wave frequencies. The output power of the amp-cell can be boosted further using multiple stacked amp-cells to increase maximum output voltage swing without exceeding the allowable voltage stresses on the junctions of the transistors. However, stacking amp-cells can reduce the power gain because the gate capacitance in each transistor functions as negative feedback in the corresponding amp-cell. This negative feedback reduces the gain of the corresponding amp-cell and limits the operation frequency of the stacked topology to low mm-wave frequencies.

Various embodiments of a disclosed "matched-cascode" amp-cell are configured to deliver higher $P_{out}$ at a higher power gain at high mm-wave frequencies compared to a traditional cascode amp-cell. Ideally, when an amp-cell achieves a sufficient power gain at the intended operating frequencies, it is also desirable that the amp-cell generates high $P_{out}$ without experiencing a compression in gain (or "gain compression" hereinafter). Generally speaking, the gain compression is caused by one or more transistors leaving their linear region, or clipping in the output voltage when it exceeds the rail voltages (e.g., 0V and $2V_{Sup}$). The change of operation region changes the transfer function of the amp-cell for a fraction of an input cycle which leads to in harmonic generation and the aforementioned gain compression. To avoid gain compression at low output powers, the amp-cell can be designed such that the output voltage reaches its rail-to-rail swing before one or more transistors in the amp-cell exit their linear region. This ensures that gain compression does not happen before maximum linear output power is reached.

Figure 7A:
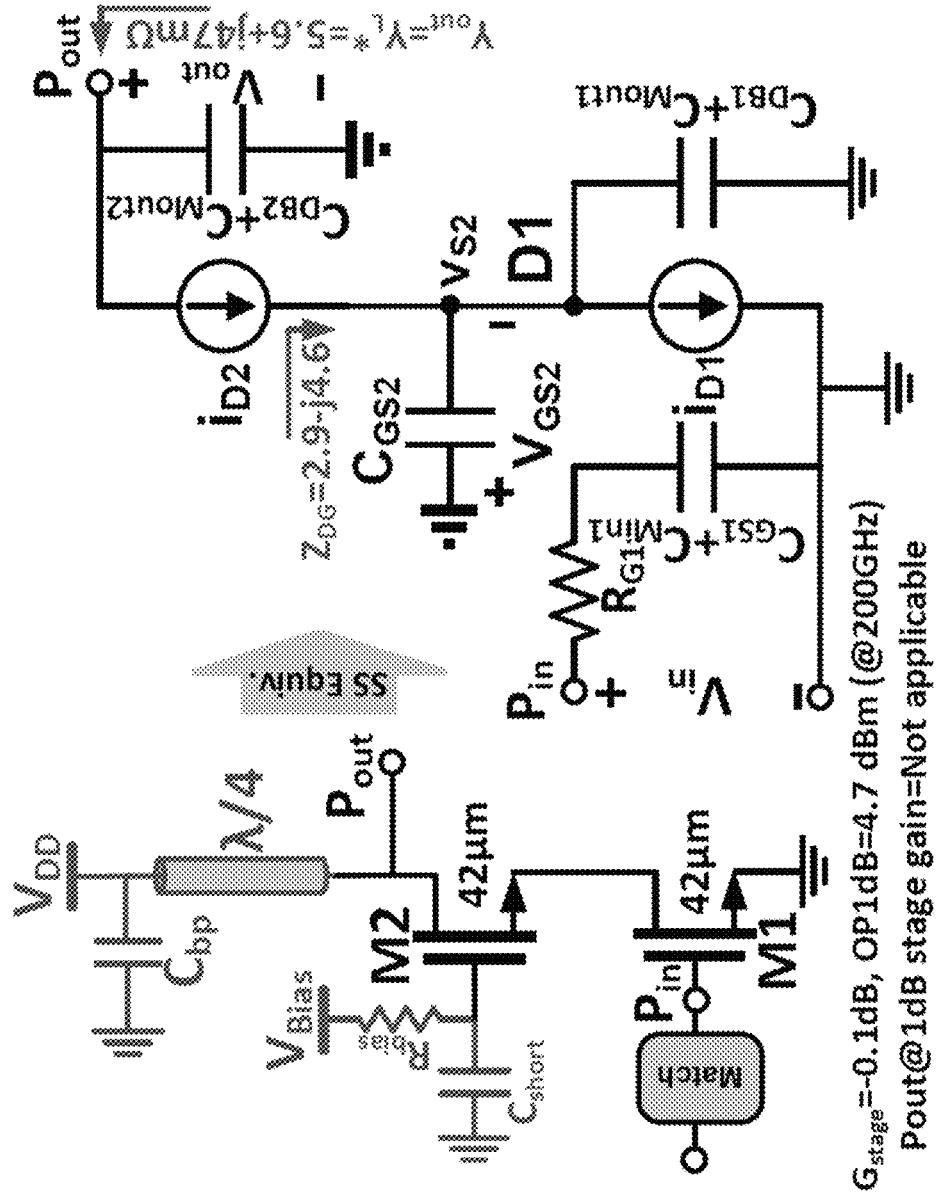
FIG. 7A shows a traditional cascode amp-cell on the left and the corresponding small-signal equivalent circuit on the right.

Generally speaking, a CMOS transistor exits its linear region when its $V_{GS}$ falls below the threshold voltage ($V_{th}$), corresponding to the Off region, or when $V_{GD}$ exceeds $V_{th}$, corresponding to Triode region. FIG. 7A shows a traditional cascode amp-cell 700 on the left and the corresponding small-signal equivalent circuit on the right. Starting with the size of the transistors, it is assumed that the maximum transistor size that results in an acceptable matching loss is selected for the CS transistor $M_1$. The size of the common-gate (CG) transistor $M_2$ can be selected to be the same as the size of $M_1$ to ensure equal drain-source voltages without altering the optimum gate biasing voltages for maximum gate-source/gate-drain swing. The right side of FIG. 7A shows the small-signal equivalent of the amp-cell 700. As can be seen in the small-signal equivalent figure, the $C_{GD}$ of the transistors are split to two miller capacitors at the gate and drain terminals, $C_{Min}$ and $C_{Mout}$, respectively. To achieve a high output power, the drain current $I_{D2}$ of $M_2$ should be maximized without pushing $V_{GS2}$ and $V_{DS2}$ into nonlinear regions. However, because $M_1$ and $M_2$ generally have large sizes and the operating frequency is high, the total parasitic capacitor $C_p = C_{DB1} + C_{Mout1} + C_{GS2}$ at the common node between the drain of $M_1$ and the source of $M_2$ has a very small impedance $1/j\Omega C_p$ at high mm-wave frequencies, leading to a small $V_{GS2}$. The small $V_{GS2}$ directly results in a small $I_{D2}$, and consequently a small output power.

Note that in this traditional cascode amp-cell design, to achieve a high $I_{D2}$, a large $V_{GS1}$ is needed in order to generate a large drain current $I_{D1}$ of $M_1$ and a large $V_{GS2}$. However, and as a result, before a high $I_{D1}$ could be delivered to the load, $M_1$ enters Off region, compressing the power gain and limiting the OP1 dB value of this amp-cell. Consequently, a traditional cascode amp-cell design such as cascode amp-cell 700 in FIG. 7A neither has high power gain nor high OP1 dB at high mm-wave frequencies. For example, a particular configuration of cascode amp-cell 700 has a power gain of 2.9 dB at 200 GHz. However, the overall stage gain of amp-cell 700 is reduced to –0.1 dB after a 3 dB matching loss at 200 GHz. The same configuration of amp-cell 700 also has an OP1 dB of 4.7 dBm when amp-cell 700 is matched to its conjugate load impedance and supplied from a $V_{DD}$=2.4V. In this example, the output power of amp-cell 700 at 1 dB stage-gain is not defined for the reason that the obtained small-signal stage-gain is only –0.1 dB.

Figure 7B:
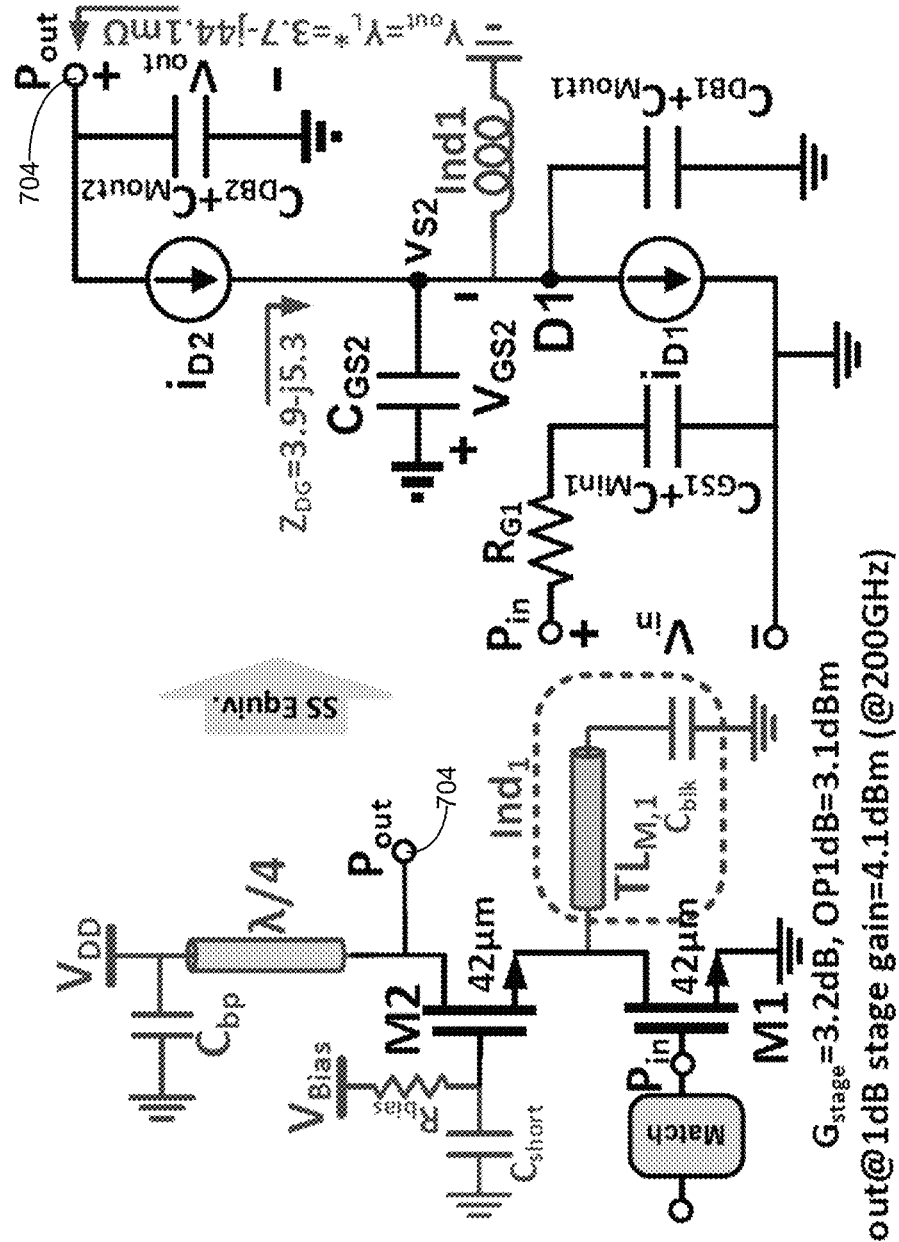
FIG. 7B shows a modified cascode amp-cell on the left including a tuning inductor $Ind_1$ to achieve higher power gain and the corresponding small-signal equivalent circuit on the right.

To mitigate the low impedance at drain node $D_1$, an inductor can be added between node $D_1$ and the ground to resonate out the parasitic capacitances. For example, FIG. 7B shows a modified cascode amp-cell 702 on the left including a tuning inductor $Ind_1$ to achieve higher power gain and the corresponding small-signal equivalent circuit on the right. Specifically, tuning inductor $Ind_1$ is added between the drain node of $M_1$ and the ground to achieve higher power gain. Note that the particular embodiment of tuning inductor $Ind_1$ in cascode amp-cell 702 is composed of a transmission line $TL_{M,1}$ and a DC block capacitor $C_{blk}$. However, other embodiments of tuning inductor $Ind_1$ can include other forms of inductor implementations other than a transmission line. Generally speaking, what tuning inductor $Ind_1$ does is that $Ind_1$ along with parasitic capacitor $C_{DB1}+C_{Mout1}$ create a parallel LC tank which can be tuned (e.g., by selecting the correct value for $Ind_1$) to have a large impedance at the desired operating frequency. Due to the high impedance of the LC tank, more drain current $I_{D1}$ chooses to flow to the source of $M_2$ and hence towards the output port 704, thereby causing increases in $V_{GS2}$ swing. An increased $V_{GS2}$ consequently boosts the power gain ($P_{out}/P_{in}$) of modified cascode amp-cell 702 in comparison to cascode amp-cell 700. For example, simulation shows that modified cascode amp-cell 702 has an overall small-signal stage gain of 3.2 dB at 200 GHz, which is significantly higher than –0.1 dB of cascode amp-cell 700 in FIG. 7A. Moreover, amp-cell 702 also has an OP1 dB of 3.1 dBm and delivers 4.1 dBm to the load at 1 dB stage-gain at 200 GHz.

However, the resonance induced by adding inductor $Ind_1$ also degenerates the source of $M_2$ by causing a higher impedance $Z_{DG}$ seen by the source terminal of $M_2$. This effect results in a smaller conductance in the output admittance $Y_{out}$ at the output port 704 of modified cascode amp-cell 702. For example, simulation shows that the conductance portion of $Y_{out}$ in cascode amp-cell 702 is reduced to 3.7 MΩ in comparison to the conductance portion of $Y_{out}$ in cascode amp-cell 700 which is 5.6 MΩ. Consequently, the conductance of the conjugate-matched load $Y^*_L$ also drops which in turn causes the decline of $P_{o,max}$ according to Eqn. 1.

Figure 7C:
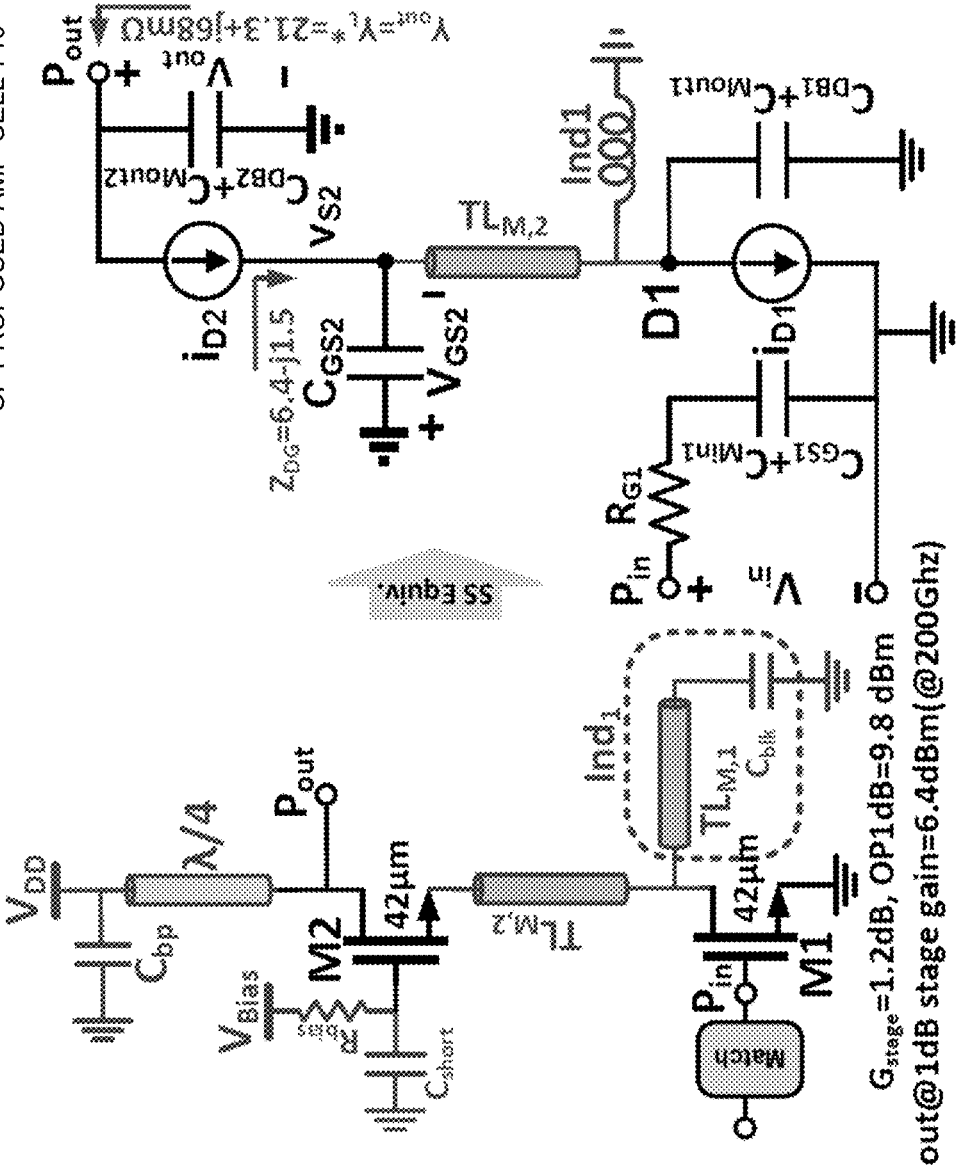
FIG. 7C shows a proposed cascode amp-cell on the left which includes a transmission line $TL_{M,2}$ coupled between the drain terminal of $M_1$ and source terminal of $M_2$ in accordance with some embodiments.

Improved cascode amp-cell designs are provided to optimize the impedance $Z_{DG}$ seen by the source terminal of $M_2$. In particular, to increase the output power $P_{out}$ based on Eqn. 1, it is necessary to increase the conductance portion $G_L$ of $Y_{out}$ in a given cascode amp-cell design. FIG. 7C shows a proposed cascode amp-cell 710 on the left which includes a transmission line $TL_{M,2}$ coupled between the drain terminal of $M_1$ and source terminal of $M_2$ in accordance with some embodiments. FIG. 7C also shows the small-signal equivalent circuit of the proposed cascode amp-cell 710 on the right. This proposed cascode amp-cell 710 can be referred to as a "matched-cascode" because the newly-added transmission line $TL_{M,2}$ in combination with the resonant inductor or $Ind_1$ can be tuned to significantly increase the power flow from $M_1$ to $M_2$, and eventually to the load.

Specifically, transmission line $TL_{M,2}$ increases the resistance of impedance $Z_{DG}$ (e.g., from 3.9Ω in amp-cell 702 to 6.4Ω in amp-cell 710) while at the same time decreases the reactance's absolute value of $Z_{DG}$ (e.g., from 5.3Ω in amp-cell 702 to 1.5Ω in amp-cell 710). This increases the resistance to reactance ratio of the degeneration impedance, which in turn increases the resistance to reactance ratio at the output of the amp-cell 710. Consequently, the conductance $G_L$ of $Y_{out}$ increases (e.g., from 3.7 MΩ in amp-cell 702 to 21.3 MΩ in amp-cell 710), which eventually increases the output power $P_{out}$. For example, simulation shows that proposed cascode amp-cell 710 has an OP1 dB of 9.5 dBm and an associated stage-gain of 0.8 dB at 200 GHz, which is significantly higher than the OP1 dB of 3.1 dBm of cascode amp-cell 702 in FIG. 7B.

In some embodiments, to find the optimal electrical length L for transmission line $TL_{M,2}$, length L can be increased gradually from 0 um to $\lambda/4$, wherein $\lambda$ is the electrical length of the transmission line, which is 185 um in this technology. While sweeping the electrical length L, conductance $G_L$ of $Y_{out}$ is observed and a given electrical length L that results in a maximum value of $G_L$ can be selected as the design length for $TL_{M,2}$.

Combining the Matched-Cascode Amp-Cell with an Embedding Network

Note that the proposed cascode amp-cell 710 can be combined with a T-embedding network to form an embedded PA. As described above in conjunction with FIGS. 5 and 6, the embedded PA can be tuned to significantly boost both the power gain and the maximum output power. In some embodiments, the minimum gain of the amp-cell after the T-embedding is selected to be 6 dB at 200 GHz to make 2 dB compression possible before the stage-gain falls below 1 dB. Also in some embodiments, to locate the coordinates on the $G_{ma}$=6 dB contour in the gain-plane which results in the maximum output power, a two-stage embedding technique is used.

Figures 8A, 8B:
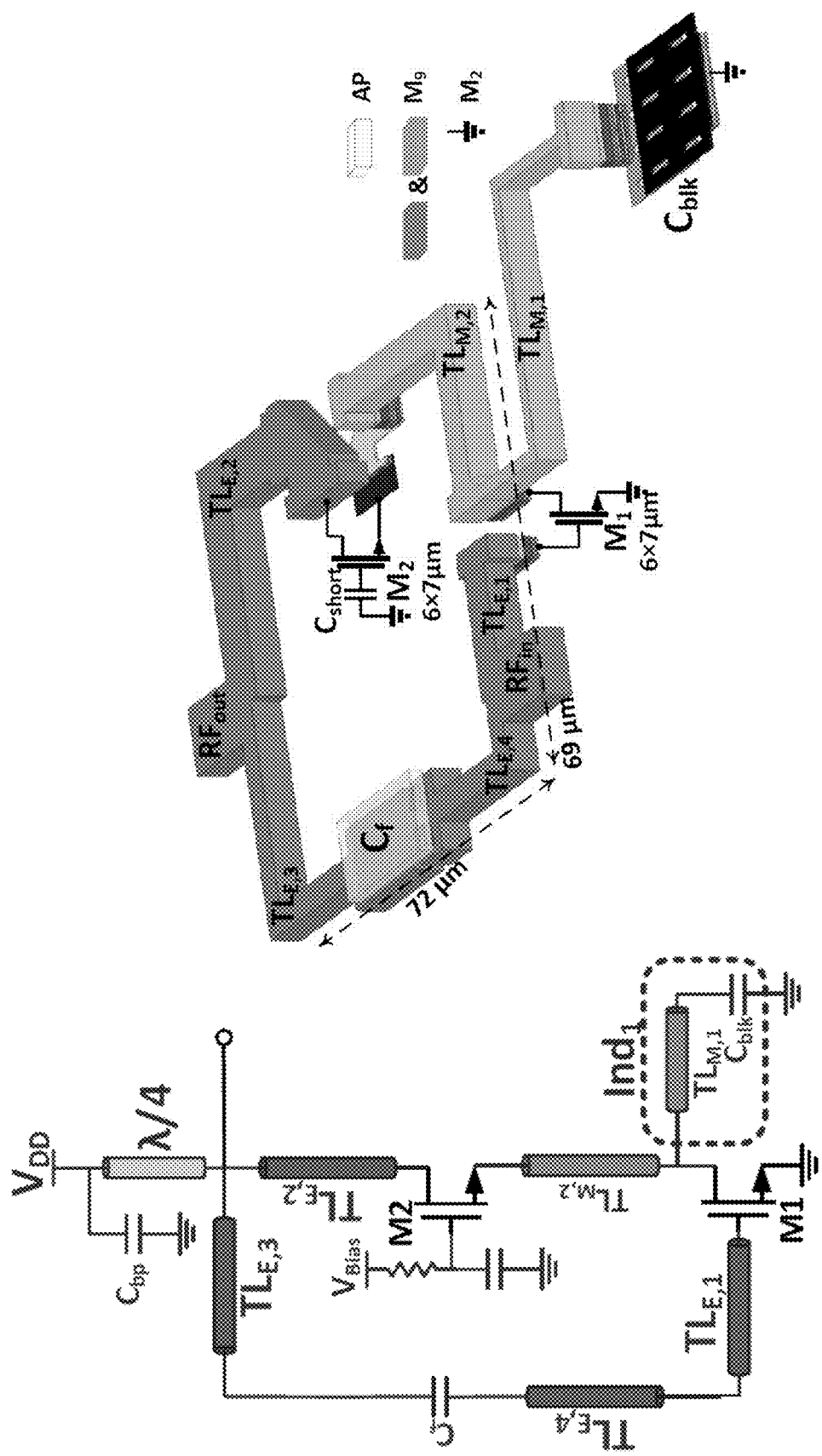
FIG. 8A shows an exemplary matched-cascode amp-cell which uses embeddings to simultaneously boost the power gain and maximize the output power of the proposed matched-cascode amp-cell in accordance with some embodiments.
FIG. 8B shows an exemplary layout design to implement the embedded matched-cascode amp-cell of FIG. 8A in a CMOS process in accordance with some embodiments.

FIG. 8A shows an exemplary matched-cascode amp-cell 800 that uses embeddings to simultaneously boost the power gain and maximize the output power of the proposed matched-cascode amp-cell in accordance with some embodiments. In the first stage of the two-stage embedding, two pre-embedding elements, and more specifically two transmission lines $TL_{E,1}$ and $TL_{E,2}$ are added to the proposed matched-cascode amp-cell 710 to adjust the direction of the movement in the gain-plane towards the desired coordinates on the $G_{ma}$=6 dB contour. Next, a parallel embedding using two additional transmission lines $TL_{E,3}$ and $TL_{E,4}$ is used to move the embedded amp-cell 800 to the desired coordinates on the $G_{ma}$=6 dB arc. Note that the embedding network in matched-cascode amp-cell 800 can also include a DC decoupling capacitor $C_f$ coupled between $TL_{E,3}$ and $TL_{E,4}$.

Note that because all the embedding elements $TL_{E,1-4}$ are lossy, U changes after the embedding. In some embodiments, to compensate for effect on U by the embedding elements, different pre-embeddings are used to move in slightly different directions and to be able to sweep the area around the desired coordinates corresponding to the maximum output power $P_{out}$. Finally, large-signal simulations are performed to fine-tune the embedding elements to achieve the maximum output power.

FIG. 8B shows an exemplary layout design 802 to implement the embedded matched-cascode amp-cell 800 in a CMOS process in accordance with some embodiments. In the particular embodiments of FIG. 8B, all of the embedding components are implemented as microstrip transmission lines in M9 metal layer of the CMOS process and M2 metal layer is used as the ground plane. The pre-embedding elements $TL_{E,1}$ and $TL_{E,2}$ have electrical lengths of $0.1\lambda$ and $0.3\lambda$, respectively (see Reference A). Such designs can be used to reduce or to avoid high loss typically associated with series embedding. In some embodiments, the parallel embedding elements $TL_{E,3}$ and $TL_{E,4}$ can have electrical lengths of $0.25\lambda$ and $0.1\lambda$, respectively.

In some embodiments, the decoupling capacitor $C_{blk}$ can be implemented as a multi-layer capacitor composed of M2 to M4 metal layers of the manufacturing process. In an exemplary embodiment, this decoupling capacitor $C_{blk}$ in conjunction with tuning inductor $TL_{M,1}$ forms a 26 pH inductor having a quality factor of 11 at 200 GHz. As mentioned above, all of the embedding elements can be implemented in M9 metal layer of the manufacturing process.

Figure 9A:
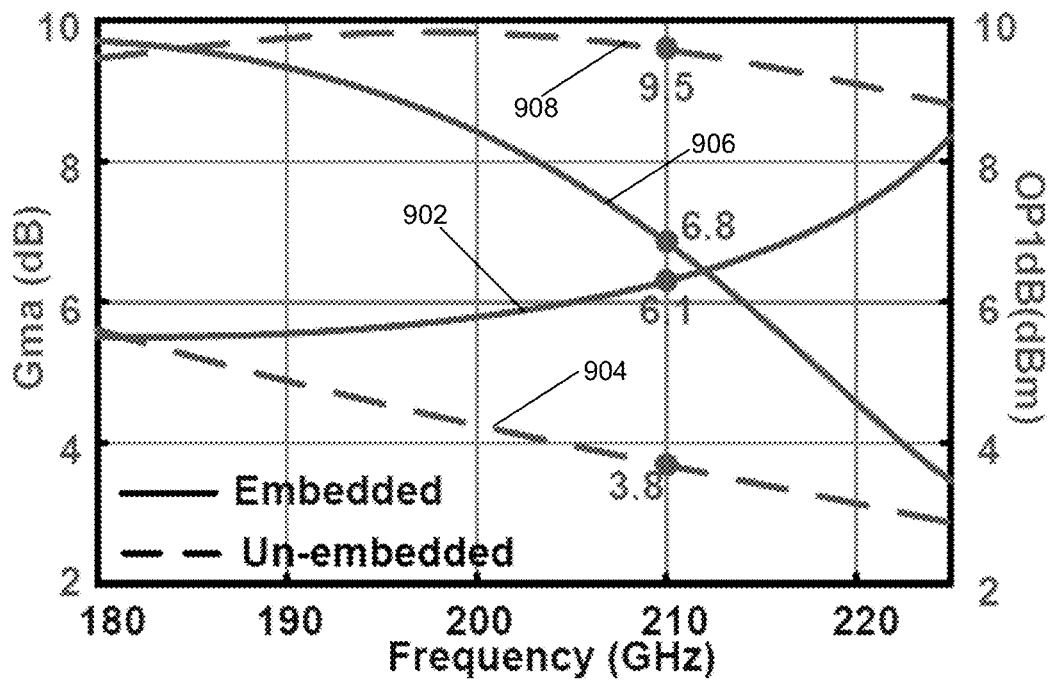
FIG. 9A shows the simulated maximum available gains ($G_{ma}$) and output 1 dB compression (OP1 dB) points of the matched-cascode amp-cell vs. frequency with and without embedding in accordance with some embodiments.

FIG. 9A shows the simulated maximum available gains ($G_{ma}$) and output 1 dB compression (OP1 dB) points of the matched-cascode amp-cell vs. frequency with and without embedding in accordance with some embodiments. More specifically, curves 902 and 904 correspond to $G_{ma}$ vs. frequency with and without embedding, respectively; whereas curves 906 and 908 correspond to OP1 dB vs. frequency with and without embedding, respectively. As can be seen in FIG. 9A, the power gain $G_{ma}$ was boosted by 2.3 dB at 210 GHz with the embedding compared with no embedding.

Figure 9B:
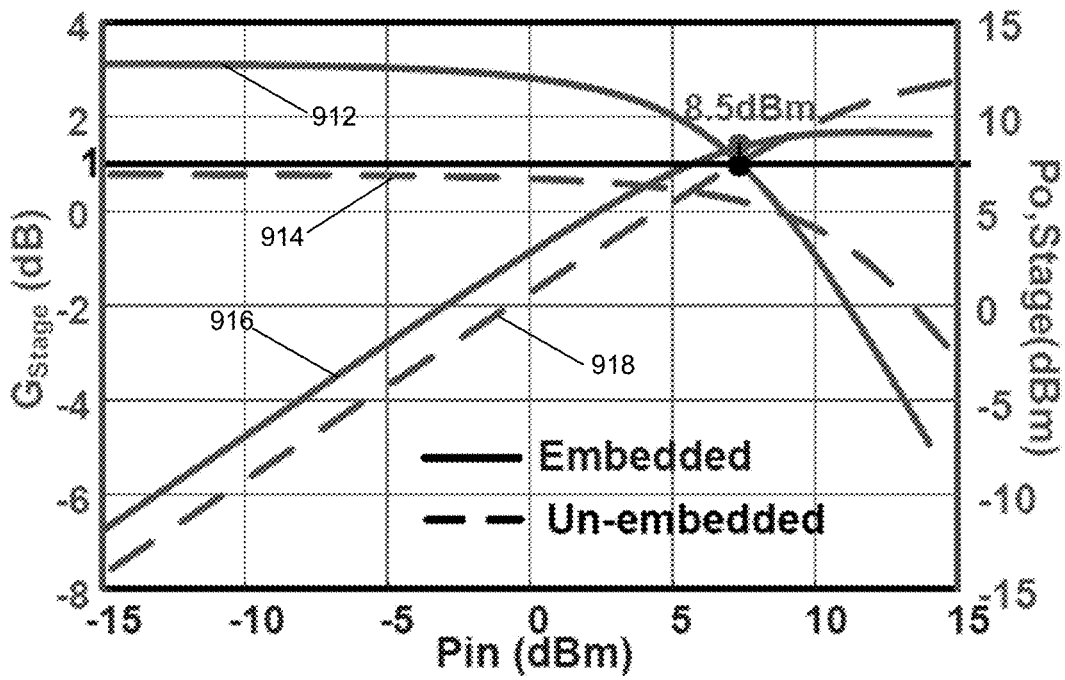
FIG. 9B shows the simulated stage gain ($G_{stage}$) and stage output power at 1 dB stage-gain ($P_{o,Stage}$) of the matched-cascode amp-cell vs. the stage input power ($P_{in}$) with and without embedding in accordance with some embodiments.

FIG. 9B shows the simulated stage gain ($G_{Stage}$) and stage output power at 1 dB stage-gain ($P_{o,Stage}$) of the matched-cascode amp-cell vs. the stage input power ($P_{in}$) with and without embedding in accordance with some embodiments. More specifically, curves 912 and 914 correspond to $G_{Stage}$ vs. $P_{in}$ with and without embedding, respectively; whereas curves 916 and 918 correspond to $P_{o,Stage}$ vs. $P_{in}$ with and without embedding, respectively. As can be seen in FIG. 9B, an 8.5 dBm output power at 1-dB stage-gain have been achieved at 210 GHz with embedding, which are both higher than the corresponding values when no embedding was used.

A New Slot Power Combiner Design

In the various amp-cell embodiments described above, we have demonstrated that by using both large transistor sizes and the proposed matched-cascode amp-cell design to increase the output swing, and optionally in combination with the disclosed embedding techniques, or independently using the disclosed embedding techniques, the output power of a PA can be significantly increased. To further boost the output power of a PA, two parallel channels of cascaded PA chains can be used, and the output power from each of the two PA chains can be combined at the end of PA chains using a power combiner to obtain a higher combined output power. However, existing power combiners are known to suffer from a number of deficiencies such as high losses and large/imbalanced impedances at their input ports. More specifically, large input impedances of a traditional power combiner can significantly increase the impedance transformation ratio of a matching network located between the last amp-cell in each PA chain (or "the last PA cell" hereinafter) and an input port of the power combiner, thereby increasing the matching loss (see Reference A). On the other hand, imbalanced input impedances can not only result in non-optimal loading of the last PA cells in the two PA channels, but can also cause phase mismatches in the output signals; both of the above-described deficiencies can adversely affect the total output power of the power combiner.

Figure 10:
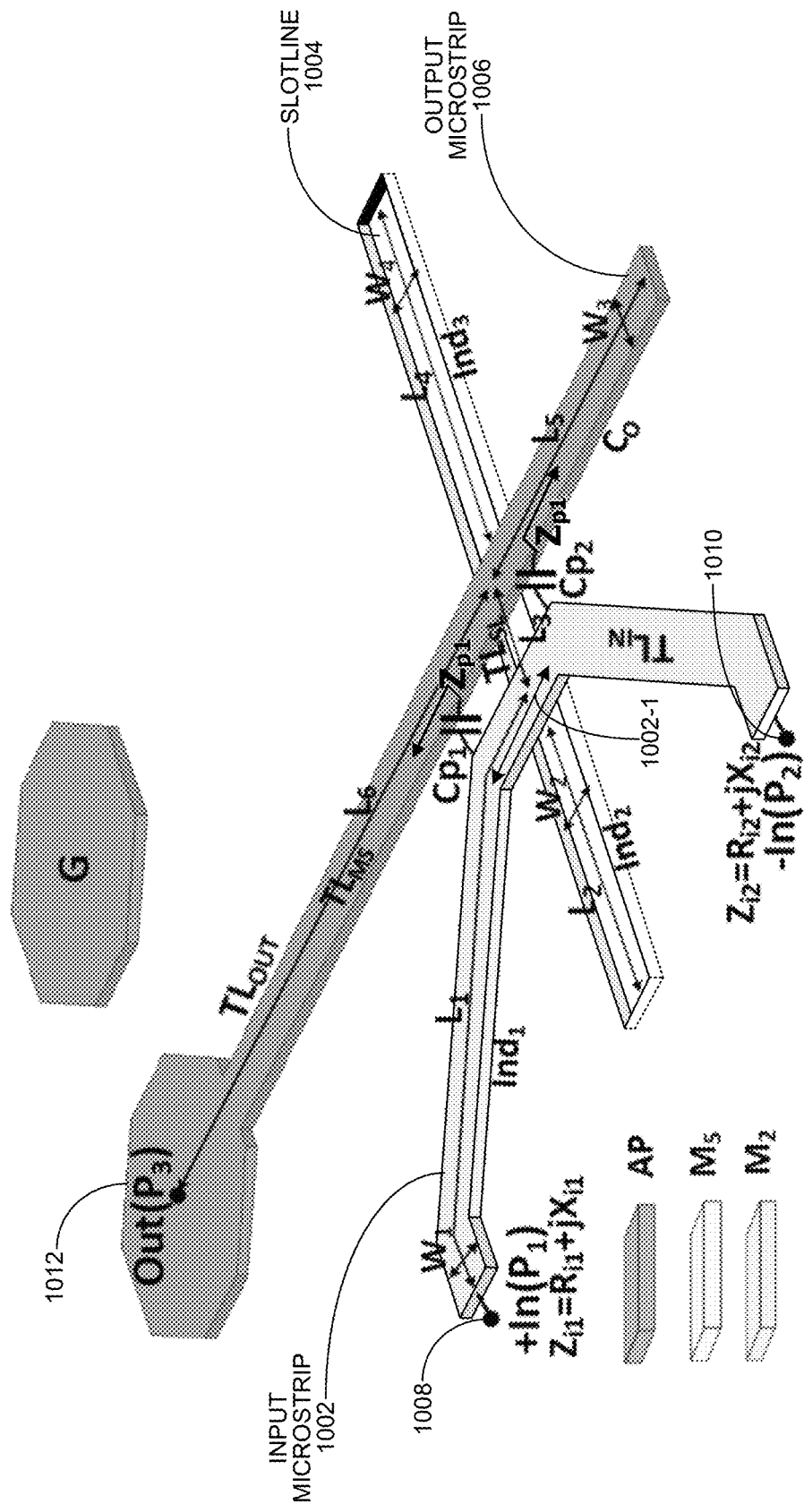
FIG. 10 shows a proposed 2-to-1 slot power combiner (SPC) in accordance with some embodiments.

To mitigate the above-described deficiencies associated with the existing power combiners used in PA designs, various embodiments of a low-loss, low input impedance, wideband, balanced slot power combiner are also provided. FIG. 10 shows a proposed 2-to-1 slot power combiner (SPC) 1000 in accordance with some embodiments. As can be seen in FIG. 10, SPC 1000 can include an input microstrip 1002, a slotline 1004 positioned below microstrip 1002, and an output microstrip 1006 positioned perpendicular to slotline 1004 and partially parallel to input microstrip 1002. Note that input microstrip 1002 further includes a straight center section/transmission line 1002-1 positioned on top of and substantially perpendicular to slotline 1004. Beyond middle section 1002-1, input microstrip 1002 is bent away from output microstrip 1006 to form a symmetric arched geometry, wherein the two ends of input microstrip 1002 are used as the two input ports 1008 and 1010 of SPC 1000. Consequently, two out-of-phase output signals from the last PA cells of two differential PA channels can be coupled into the two input ports 1008 and 1010, respectively, as two input signals.

Note that even though a small section of input microstrip 1002, i.e., 1002-1 is shown to be close to and parallel with output microstrip 1006, the large portion of input microstrip 1002 is configured to maintain a much larger distance from output microstrip 1006. This allows for keeping the insertion loss $S_{31}$ of SPC 1000 as low as possible. Generally speaking, the designs of SPC 1000 aim to reduce or avoid direct electrically-decoupling between input microstrip 1002 and output microstrip 1006. In some embodiments, input microstrip 1002 and output microstrip 1006 are implemented in two different metal layers (e.g., M5 metal layer and aluminum (AP) layer, respectively) which are not electrically connected. An exemplary configuration of SPC 1000 can have the following set of geometric values: $W_1$, $W_2$, $W_3$, $W_4$ are equal in value at 12 μm, $L_1$=86 μm, $L_2$=44 μm, $L_3$=15.5 μm, $L_4$=105 μm, $L_5$=117 μm, and $L_4$=118 μm. However, in other embodiments of SPC 1000, each of the above geometries associated with input microstrip 1002, slotline 1004, and output microstrip 1006 can have other length or width values.

Note that when two out-of-phase input signals are received by the two input ports 1008 and 1010 of input microstrip 1002, a differential, i.e., the combined signal, is generated at transmission line (TL) 1002-1 to induce a current in TL 1002-1. This current subsequently induces an electromagnetic (EM) wave in slot-line 1004. The reciprocal effect then takes place between slotline 1004 and output microstrip 1006 to induce another current in microstrip 1006, which is positioned in parallel with TL 1002-1. In this manner, the combined signal of the two out-of-phase input signals can be delivered to the load, e.g., which can be coupled to an output signal pad 1012 at an end of microstrip 1006.

Figure 11A:
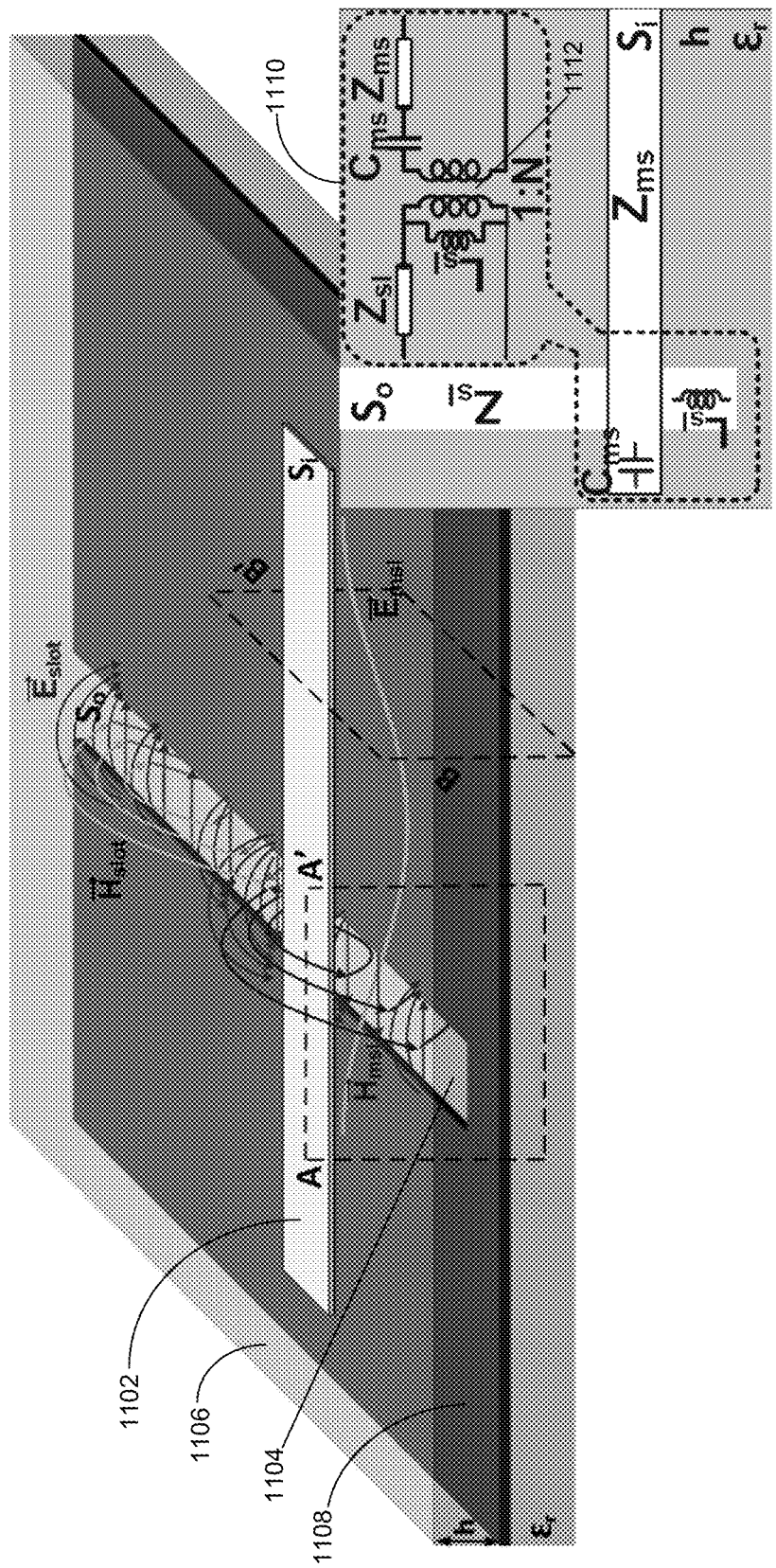
FIG. 11A shows a microstrip-slotline model to demonstrate signal transitions between a microstrip and a slotline in accordance with some embodiments.

FIG. 11A shows a microstrip-slotline model 1100 to demonstrate signal transitions between a microstrip and a slotline in accordance with some embodiments. As can be seen in FIG. 11A, a microstrip 1102 is disposed on a substrate 1106 having a height of h and permittivity of $\varepsilon_r$, wherein microstrip 1102 is also positioned perpendicular to and over a slotline 1104, which is etched in a ground plane 1108. Assuming that an input signal $S_i$ is fed to microstrip 1102 from the right side, a time-varying electric field $E_{msl}(t)$ and a time-varying magnetic field $H_{msl}(t)$ then start traveling leftward towards the other end of microstrip 1102.

Figure 11B:
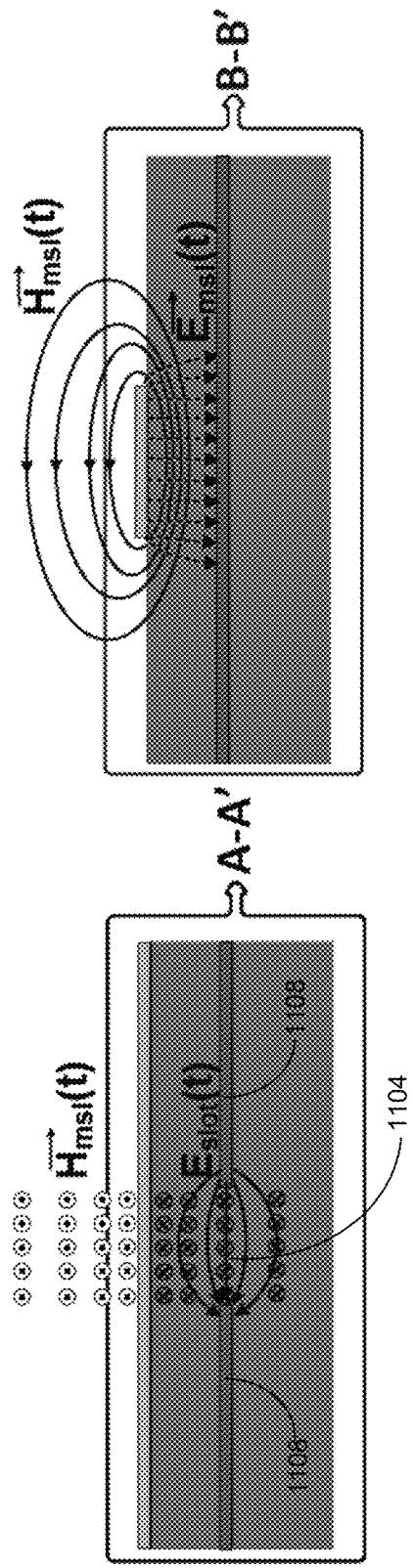
FIG. 11B illustrates the mechanisms of signal transition and propagation through electrical and magnetic field coupling in the proposed microstrip-slotline structure in accordance with some embodiments.

FIG. 11B illustrates the mechanisms of signal transition and propagation through electrical and magnetic field coupling in the proposed microstrip-slotline structure in accordance with some embodiments. As can be seen in FIG. 11B, at the region where microstrip 1102 intersects with slotline 1104, the time-varying field $H_{msl}(t)$ induces a time-varying electric field $E_{slot}(t)$ perpendicular to the edges of slotline 1104. The induced electric field $E_{slot}(t)$ then generates a voltage across the edges of slotline 1104 which changes with time and further results in a time-varying current in slotline 1104. This time-varying current subsequently generates a time-varying magnetic field $H_{slot}(t)$ in slotline 1104 (see FIG. 11A), which propagates along with $E_{slot}(t)$ to an output port of slotline 1104, shown at the top end of slotline 1104 in FIG. 11A. Note that the above-described electro-magnetic field transitions can naturally occur in reverse manner from slotline 1104 to microstrip 1102.

In some embodiments, the above-described microstrip-to-slotline signal transition can be modeled by using an equivalent resonant circuit 1110 of the proposed microstrip-slotline structure, wherein the equivalent circuit 1110 is shown in the bottom right inset of FIG. 11A. As can be seen in the inset, equivalent resonant circuit 1110 can include a transformer 1112 having a transformation ratio of N, wherein N is typically a function of the characteristic impedances $Z_{ms}$ and $Z_{sl}$ of microstrip 1102 and slotline 1104, respectively. Moreover, $L_{sl}$ in equivalent circuit 1110 represents the inductance of slotline 1104 which is shorted and $C_{ms}$ represents the capacitance of microstrip 1102 which is in an open circuit state.

Referring back to FIG. 10, note that to use the inputs of the 2-to-1 SPC 1000, two out-of-phase signals are simultaneously fed to the input microstrip 1002, one signal to each end of the microstrip. Again, a first signal/power transition from microstrip 1002 to slotline 1004 occurs at an overlapping region between microstrip 1002 and slotline 1004, wherein the combined signal of the two out-of-phase input signals is coupled from microstrip 1002 to slotline 1004. The combined signal traveling through slotline 1004 subsequently arrives at a second overlapping region between slotline 1004 and output microstrip 1006 positioned perpendicular to and over slotline 1004. The signal in slotline 1004 is subsequently coupled into output microstrip 1006 through the second signal/power transition from slotline 1004 to microstrip 1006, wherein the second transition occurs in a reciprocal manner to the first transition from microstrip 1002 to slotline 1004. Because output microstrip 1006 is also coupled to output signal pad 1012, the combined signal/power in microstrip 1006 can then be delivered to the load (not shown) coupled to output signal pad 1012.

Note that in the proposed SPC 1000, input microstrip 1002 is constructed to be symmetrical with respect to slotline 1004 to allow balanced input impedances $Z_{i1}$ and $Z_{i2}$ to be achieved. In the middle section of SPC 1000 structure, two parasitic capacitors $C_{p1}$ and $C_{p2}$ can be seen coupled between the input and output microstrips 1002 and 1006. Note that these two capacitors can see different impedances ($Z_{p1}$ and $Z_{p2}$) and therefore can become a source of imbalance between the two inputs of SPC 1000. However, input microstrip 1002 and output microstrip 1006 can be implemented in different metal layers, and the section of input microstrip 1002 in parallel with microstrip 1006 can be made as short as possible. As such, $C_{p1}$ and $C_{p2}$ can generally be very small and the mismatch/imbalance between the two input impedances $Z_{i1}$ and $Z_{i2}$ caused by $C_{p1}$ and $C_{p2}$ mismatch can often be negligible.

Figure 12A:
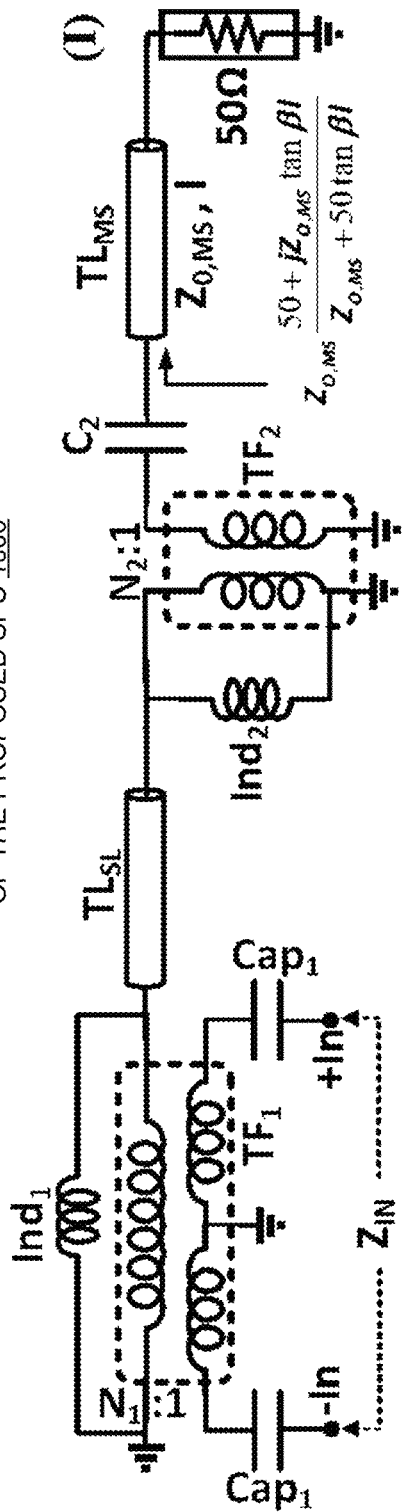
FIG. 12A shows an equivalent circuit of the proposed SPC in accordance with some embodiments.
Figure 12B:
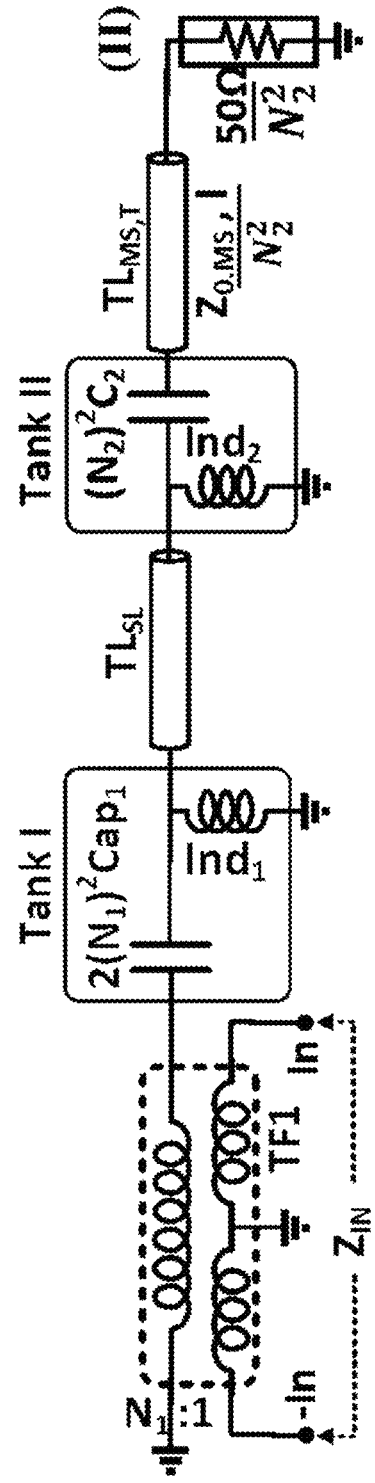
FIG. 12B shows another equivalent circuit of the proposed SPC in accordance with some embodiments.

FIG. 12A shows the equivalent circuit 1200 of the proposed SPC 1000 in accordance with some embodiments. Note that because the input signal experiences two transitions between slotline 1004 and the two microstrips 1002 and 1006, equivalent circuit 1200 includes two transformers $TF_1$ and $TF_2$, wherein each transformer can include inductor components as well as capacitor components, as shown in FIG. 12A. Note also that the components in the second transformer $TF_2$ can be transferred to the input side of slotline 1004, so can $C_{p1}$ and $C_{p2}$ (assuming they have the same value). These transformations result in a simplified equivalent circuit 1202 of SPC 1000 as shown in FIG. 12B. Note that in simplified equivalent circuit 1202, two tank circuits Tank I and Tank II exist which create two resonant frequencies. In some embodiments, these two resonant frequencies of the proposed SPC 1000 can be designed to be far away from each other to achieve a wideband characteristic of the proposed power combiner.

Figure 13A:
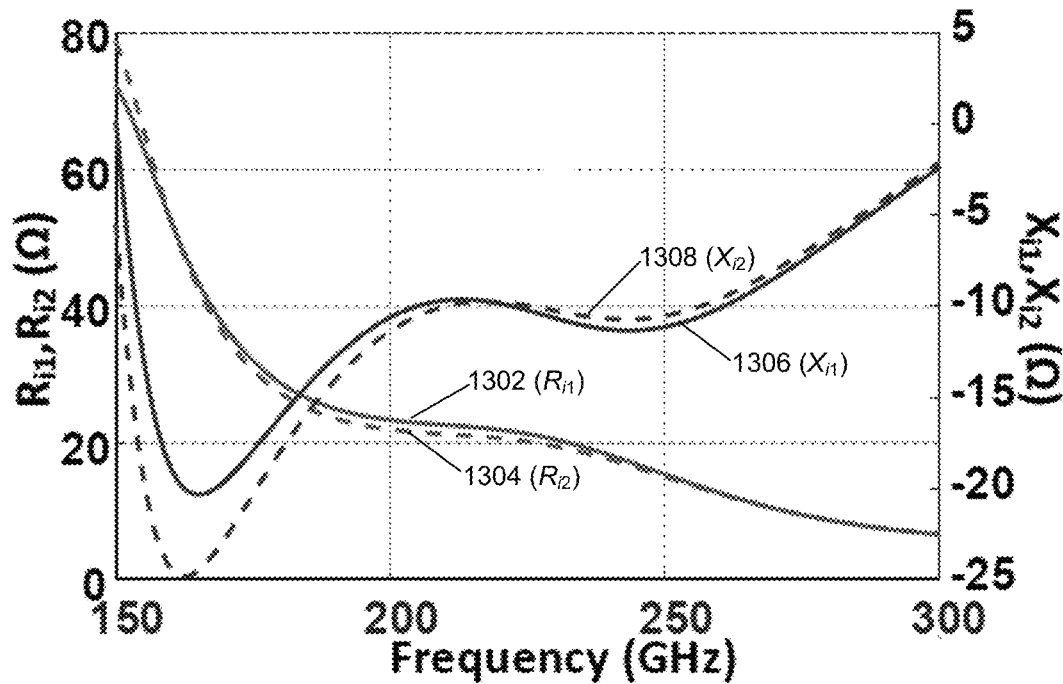
FIG. 13A shows the simulated frequency responses of the input impedances corresponding to the two input ports of the proposed SPC in FIG. 10 in accordance with some embodiments.

FIG. 13A shows the simulated frequency responses of the input impedances corresponding to the two input ports of the proposed SPC 1000 in FIG. 10 in accordance with some embodiments. More specifically, the four curves 1302, 1304, 1306, and 1308 correspond to the two resistive components ($R_{i1}$ and $R_{i2}$) of the two input ports and the two reactive components ($X_{i1}$ and $X_{i2}$) of the two input ports, respectively. FIG. 13A shows that the two input impedances $Z_{i1}$ and $Z_{i2}$ at the two input ports 1008 and 1010 of the proposed SPC 1000 can be designed to be very close to each other in both resistive $R_i$ and reactive $X_i$ components across a wide range of frequencies from 170 GHz to 300 GHz.

Figure 13B:
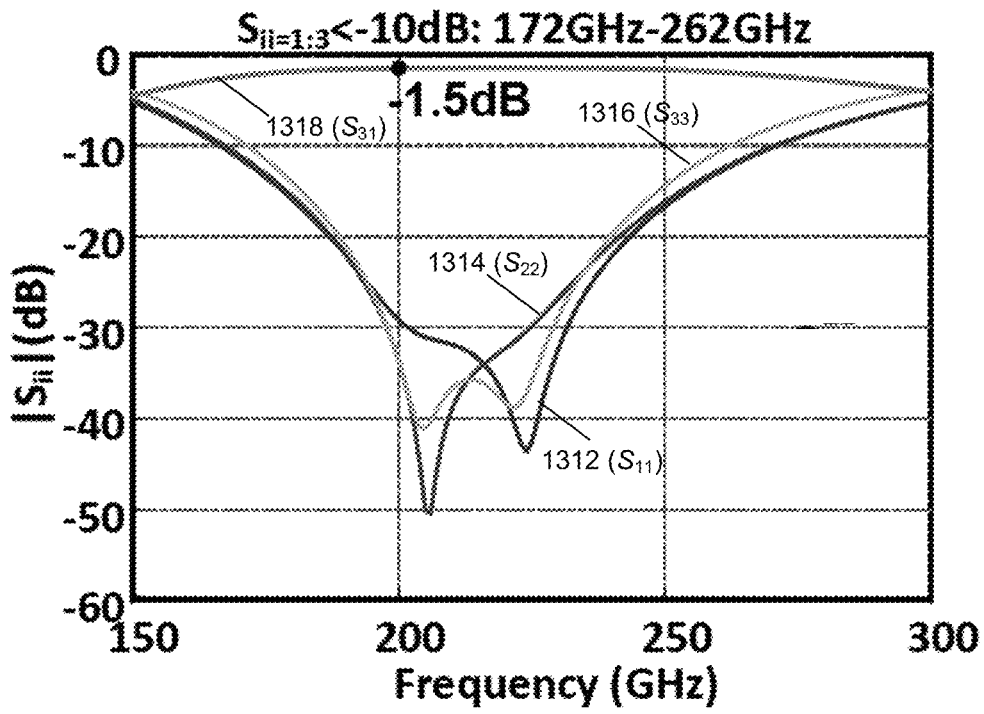
FIG. 13B shows the simulated S-parameters of the proposed SPC in FIG. 10 to illustrate the wideband performance of proposed SPC in accordance with some embodiments.

FIG. 13B shows the simulated S-parameters of the proposed SPC 1000 in FIG. 10 to illustrate the wideband performance of proposed slot power combiner in accordance with some embodiments. More specifically, the four curves 1312, 1314, 1316, and 1318 correspond to the frequency responses of the four S-parameters $S_{11}$, $S_{22}$, $S_{33}$, and $S_{31}$, respectively. Specifically, $S_{11}$, $S_{22}$, $S_{33}$ are the return losses of the two input ports (1 and 2) and the output port of SPC 1000, respectively, and $S_{31}$ is the insertion loss from input port 1 to the output port. FIG. 13B shows that the return losses at both input ports ($S_{11}$ and $S_{22}$) stay lower than −10 dB from 172 GHz to 262 GHz, which results in 41.5% fractional bandwidth. FIG. 13B also shows the simulated insertion loss $S_{31}$ of the proposed SPC to be around 1.5 dB at 200 GHz, and an associated 1 dB bandwidth of ~74 GHz. Note that the output pads are included in the simulations which create the results shown in FIGS. 13A and 13B.

Figure 14A:
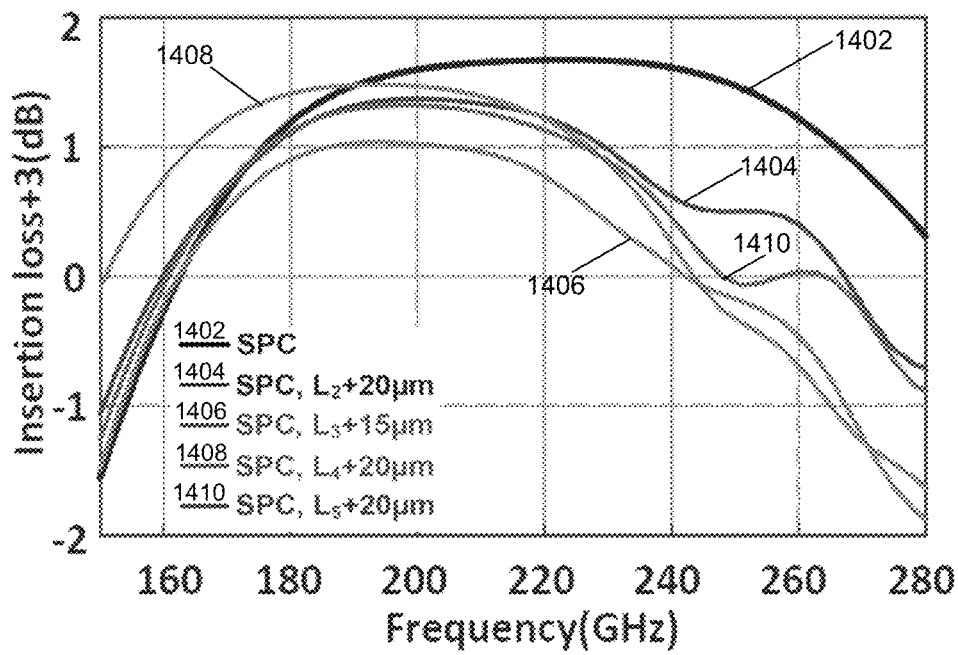
FIG. 14A shows the simulated changes in the insertion loss $S_{31}$ parameter of the proposed power combiner by changing the microstrip and slotline geometries in accordance with some embodiments.

In some embodiments, to adjust the response of the proposed slot power combiner, one can change the values of the filter/tank components shown in simplified equivalent circuit 1202 in FIG. 12B. For example, the performances of SPC 1000 can be adjusted by adjusting the lengths and/or widths of the slot-line 1004 and microstrips 1002 and 1004 in SPC 1000. Accordingly, FIG. 14A shows the simulated changes in the insertion loss $S_{31}$ parameter of the proposed SPC 1000 by changing the microstrip and slotline geometries in accordance with some embodiments. More specifically, curve 1402 in FIG. 14A corresponds to the design of SPC 1000 shown in FIG. 10. Each of the additional curves 1404, 1406, 1408, and 1410 corresponds to the results of increasing the lengths of different sections of slotline 1004

(i.e., $L_2$, $L_3$, and $L_4$) and output microstrip 1006 ($L_5$), respectively. The exemplary results in FIG. 14A show that increasing the lengths of different sections in slotline 1004 and the open end of the micro strip all result in lower center frequencies. These results can be explained as that the longer these lengths are, the larger their equivalent capacitance and inductances become in the corresponding SPC, which all lead to smaller resonance frequencies of the two tank circuits. Moreover, FIG. 14A also shows that increasing $L_3$, i.e., the gap between the two microstrip lines would decrease the insertion loss and at the same time lowers the center frequency.

Figure 14B:
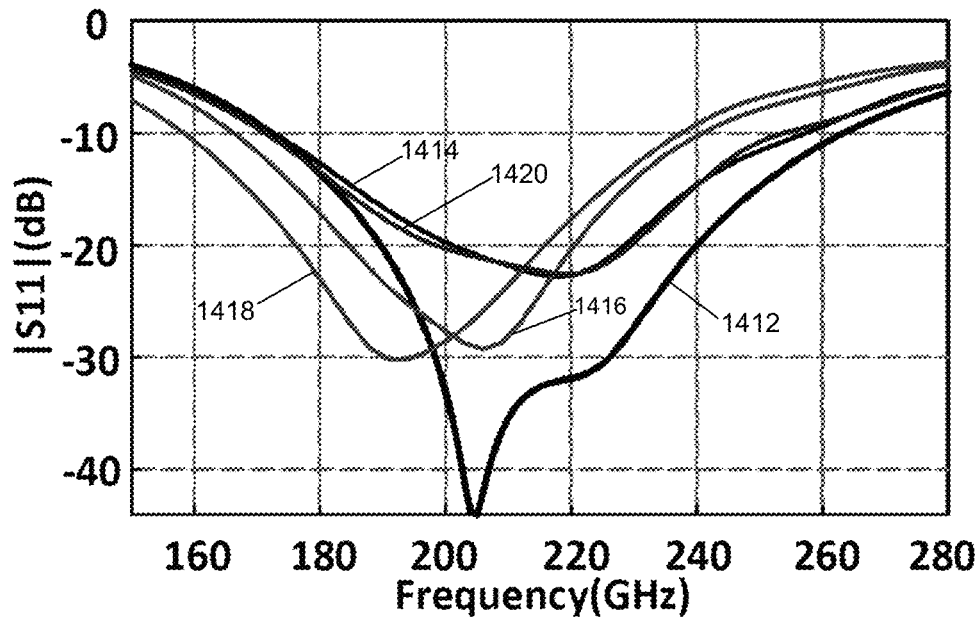
FIG. 14B shows the simulated changes in $S_{11}$ parameter of the proposed slot power combiner corresponding to the same changes in geometries as in FIG. 14A in accordance with some embodiments.

FIG. 14B shows the simulated changes in $S_{11}$ parameter of the proposed slot power combiner corresponding to the same changes in geometries as in FIG. 14A in accordance with some embodiments. Again, curve 1412 in FIG. 14B corresponds to the design of SPC 1000 in FIG. 10, and each of the additional curves 1414, 1416, 1418, and 1420 corresponds to increasing the lengths of $L_2$, $L_3$, $L_4$ and $L_5$, respectively. The results in FIG. 14B show that the input ports of the proposed SPC can stay matched for over a very wide 60 GHz bandwidth while altering the geometries of the microstrips and the slotline in the proposed SPC designs.

Implementation and Measurement Results

Figure 15:
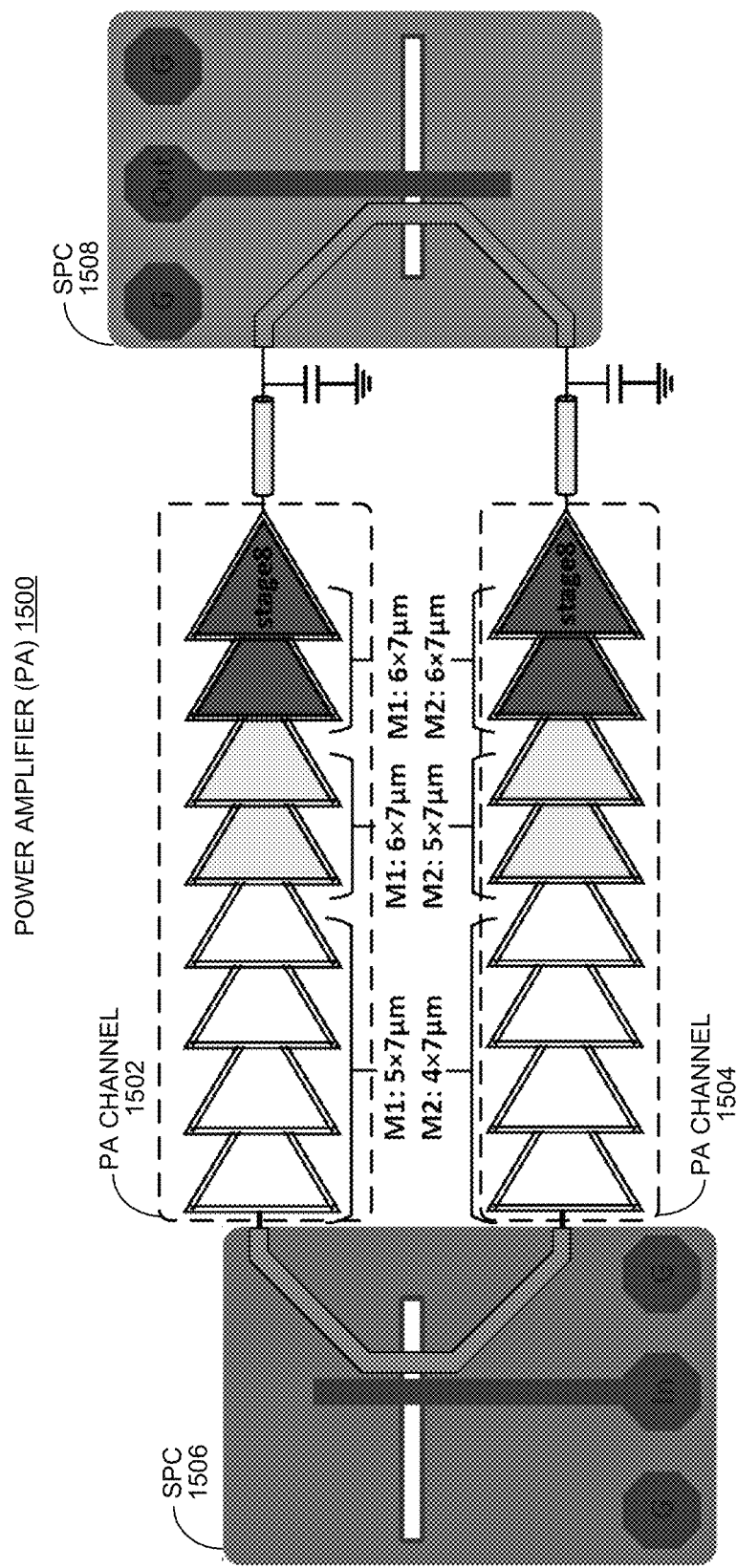
FIG. 15 shows the schematic of a 2-by-8 embedded power amplifier configured with two output-of-phase cascaded PA channels, a power divider and a power combiner in accordance with some embodiments.

FIG. 15 shows the schematic of a 2-by-8 embedded power amplifier 1500 configured with two output-of-phase cascaded PA channels 1502 and 1504, a power divider 1506, and a power combiner 1508 in accordance with some embodiments. In some embodiments, each of the 8 amp-cells in each of the PA channels is implemented with the proposed matched-cascode amp-cell described above in conjunction with FIG. 7C. As described above, this matched-cascode amp-cell allows higher voltage swing at the output port, and hence higher output power when compared to a traditional common-source amp-cell. Note that power amplifier (PA) 1500 includes both a power divider 1506 disposed at the input end of PA 1500 to split an input signal into two channels for the two PA channels 1502 and 1504, and a power combiner 1508 disposed at the output end of PA 1500 to combine the output signals from the two PA channels 1502 and 1504. In some embodiments, each of the 8 amp-cells in each of the PA channels 1502 and 1504 is implemented with the proposed matched-cascode amp-cell described above in conjunction with FIG. 7C. In some embodiments, each of the power divider 1506 and power combiner 1508 in PA 1500 is implemented with the proposed SPC 1000 described above in conjunction with FIGS. 10-12.

Figure 16:
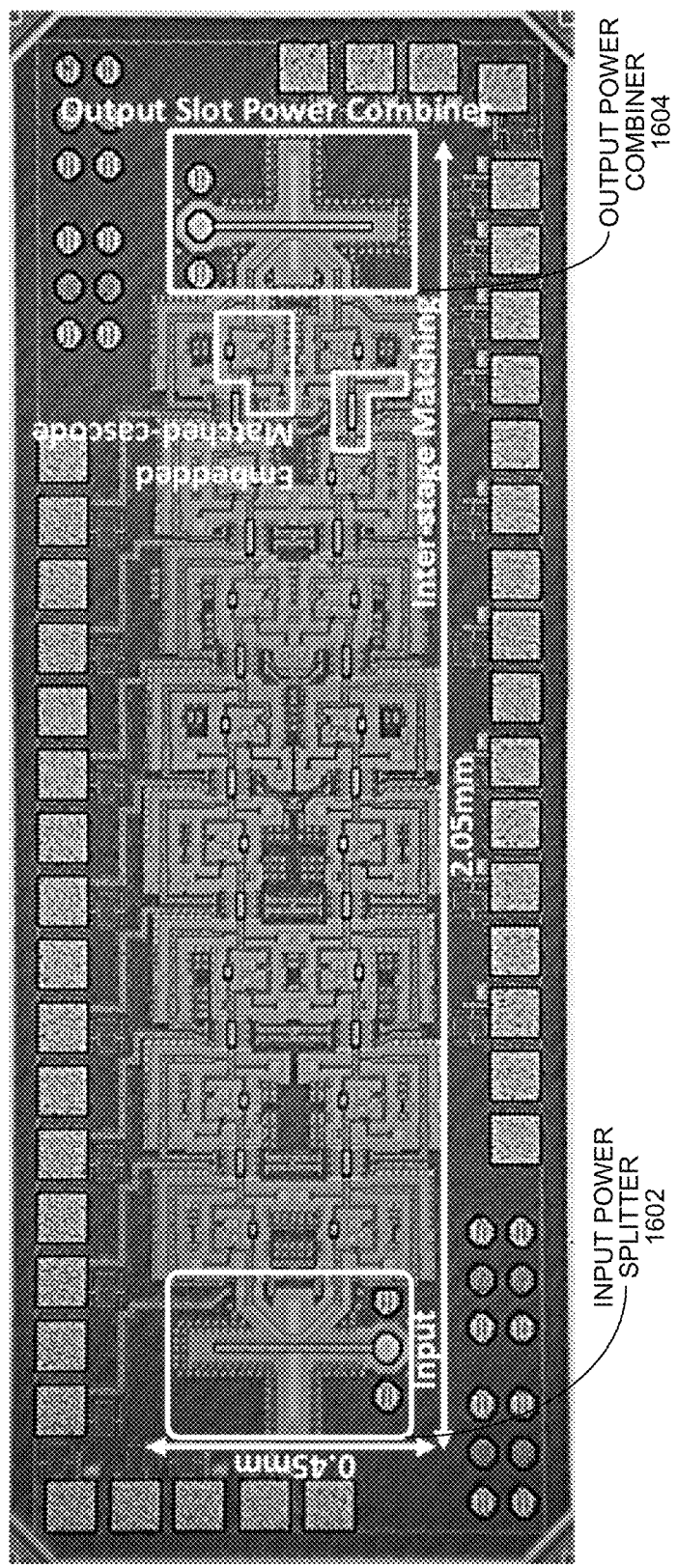
FIG. 16 shows a microphotograph of PA chip which includes one instance of the disclosed embedded PA in FIG. 15 in accordance with some embodiments.

FIG. 16 shows a microphotograph of a PA chip 1600 which includes one instance of the disclosed embedded PA 1500 in FIG. 15 in accordance with some embodiments. Note that the dimensions of the chip die 1600 are 0.95 mm×2.6 mm, where the active area including input and output pads has a dimension of 0.7 mm×2 mm. As can be seen in PA chip 1600, two parallel cascaded channels of amp-cells, 8 amp-cells in each channel are disposed between an input slot power divider 1602 and an output slot power combiner 1604. Each of the 2×8 amp-cells is implemented using the proposed matched-cascode amp-cell in TSMC 65 nm Bulk CMOS process at 200 GHz. Moreover, each of the slot power divider/combiners is implemented based on the proposed 2-to-1 SPC 1000.

Note that the implementation of neutralizing capacitors for the proposed cascode amp-cell would need very small capacitors with long transmission line routings, because of the amp-cell dimensions. Therefore, neutralizing circuit of the proposed cascode amp-cell would become ineffective.

To maximize the DC efficiency and improve the power gain of the driver stages in PA chip 1600, the sizes of the transistors are reduced towards the input of the PA. The gate biasing voltages of the M1 transistor and M2 transistor (see FIG. 8A) of the driver stages in the two PA channels can be selected to be slightly lower than those used in the last stages, because such design can improve the power gain, and reduce the DC power consumption. In the last stages of the two PA channels, higher biasing voltages are chosen to improve the output power of the PA chip. In some embodiments, the first four driver amp-cells have a simulated gain power gain of 6.9 dB and an OP1 dB of 3.1 dBm. The amp-cells of stages 5 and 6 have a simulated power of 5.9 dB, and an OP1 dB of 6.2 dBm.

The SPC 1000 shown in FIG. 10 is used at the output port of the two power amplification paths to boost the output power. The same slot power combiner can also be used at the input port. To conserve the gain of amp-cells, all of the 2×8 amp-cells are matched to their complex conjugate impedances. In some embodiments, a capacitor or inductor can be used for $jY_1$ and $jY_2$ in inter-stage matching networks when needed. In specific implementations, each PA amp-cell in the chain of PA cells is provided with a $V_{sup}$ of 2.4V. With a correct gate biasing voltages, simulation shows that the maximum voltage swing on gate-source and gate-drain junctions is ~1.1V.

A PNA-X is used together with two VDI WR-5.1 frequency extenders to measure S-parameters of the PA chip in FIG. 16. In some embodiments, the simulated $S_{11}$ and $S_{22}$ are below −10 dB from 190 GHz to 220 GHz. The measurement results showed that the exemplary PA design in FIG. 16 has a center frequency of 202 GHz, with a 3 dB bandwidth of 13.4 GHz from 195.3 GHz to 208.7 GHz. The input and output reflection coefficients were measured to be less than −6.8 and −9.1 dB from 179.5 GHz to 218.4 GHz, respectively. Simulated K and |Δ| parameters satisfied unconditional stability requirements over all frequencies. The measurement results show that the exemplary PA design 1600 is unconditionally stable and has a stability factor (K) larger than one, and |Δ| smaller than one from 140 GHz to 220 GHz.

FIG. 18 shows the summary of an exemplary implementation of the proposed power amplifier performance compared to state-of-the-art PA designs in accordance with some embodiments. The PA features the best performances in gain, $P_{sat}$, and OP1 dB in CMOS technology at >200 GHz frequencies.

Design of a High Output Power, High Power Gain Power Amplifier

Figure 17:
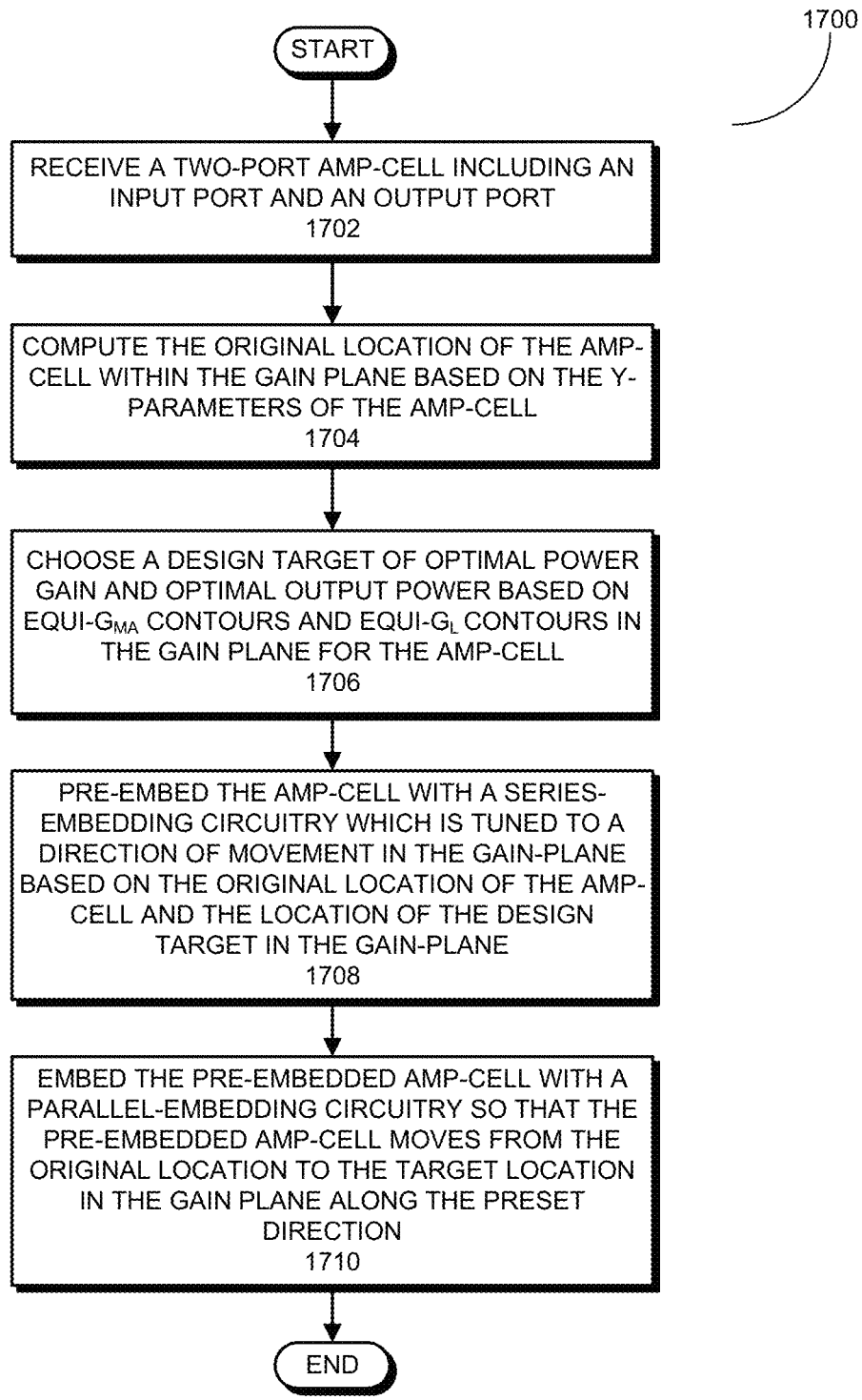
FIG. 17 presents a flow chart illustrating a process for using the disclosed embedding technique and gain-plane analytics to obtain both maximized output power and power gain for a given amp-cell in accordance with the disclosed embodiments.

FIG. 17 presents a flow chart illustrating a process 1700 for using the disclosed embedding technique and gain-plane analytics to obtain both maximized output power and power gain for a given amp-cell in accordance with the disclosed embodiments. Note that process 1700 should be understood along with the descriptions in conjunction with FIGS. 5, 6 and 8A-8B. Also note that the general tuning/design procedure of FIG. 17 can be applied to any amplifier/amp-cell when the amp-cell is embedded. Using this procedure, an arbitrary amp-cell can be tuned to achieve both maximum output power and an optimal power gain for the amp-cell. For example, the amp-cell that can be optimized for both maximum output power and power gain using process 1700 can include any of the above-described cascode amp cells 700, 702, and 710, including the proposed matched-cascode amp-cell.

The process 1700 can begin by receiving a two-port amp-cell, wherein the amp-cell includes an input port and an output port (step 1702). In some embodiments, the amp-cell least one transistor configured in an amplification mode and coupled between the input port and the output port. Next, process 1700 computes the original location of the amp-cell within the gain plane based on the Y-parameters of the amp-cell (step 1704). Note that the received amp-cell can be a non-embedded amp-cell. However, the received amp-cell can also include previous embeddings. Next, process 1700 chooses a design target of optimal power gain $G_p$ and output power $P_{out}$ based on pre-generated equi-$G_{ma}$ contours and equi-$G_L$ contours in the gain plane for the amp-cell (step 1706). For example, the design target can be an intersect between a given equi-$G_{ma}$ contour in the set of equi-$G_{ma}$ contours and a given equi-$G_L$ contour in the set of equi-$G_L$ contours, wherein the intersect has a high $G_{ma}$ value associated with the given equi-$G_{ma}$ contour, as well as a high $G_L$ value associated with the given equi-$G_L$ contour. Note that the $G_L$ value is directly related to maximum output power $P_{o,max}$ based on Eqn. 1.

As described above, the set of equi-$G_{ma}$ contours and the set of equi-$G_L$ contours can be generated in a gain plane plot for the amp-cell using contour generation technique described in conjunction with FIG. 6, wherein $G_{ma}$ is the maximum available power gain and $G_L$ is the conductance of the simultaneously-matched load admittance of the amp cell. Specifically, the disclosed contour generation process can first fill every small partition (i.e., pixels) within the stable region K≥1 in the gain plane with computed values of $G_{ma}$ and $G_L$ based on a large number of embedded configurations of the received amp-cell. Subsequent ally, the equi-$G_{ma}$ and equi-$G_L$ contours within the stable region can be numerically determined based on the calculated $G_{ma}$ and $G_L$ values.

Next, process 1700 pre-embeds the amp-cell with a series-embedding circuitry which is coupled in series to both the input port and output port of the amp-cell (step 1708). Specifically, the series-embedding circuitry is tuned to pre-set the direction of movement of the amp-cell in the gain-plane based on the original location on the amp-cell and the location of the design target in the gain plane. For example, FIG. 8A shows that the series-embedding elements, i.e., two transmission lines $TL_{E,1}$ and $TL_{E,2}$ are added to the proposed matched-cascode amp-cell 710 and their values are adjusted to set the direction of the movement in the gain plane towards the desired coordinates on the $G_{ma}$=6 dB contour.

Finally, process 1700 embeds the pre-embedded amp-cell with a parallel-embedding circuitry coupled between the input port and output port amp-cell, wherein the parallel-embedding circuitry is tuned so that the embedded amp-cell moves from the original location to the target location in the gain plane along the direction preset by the series-embedding circuitry (step 1710). As such, the embedded amp-cell including the series- and parallel-embedding circuits are configured to have both optimal/high power gain and optimal/high output power. For example, FIG. 8A shows that the parallel-embedding elements, i.e., two transmission lines $TL_{E,3}$ and $TL_{E,4}$ are added after adding $TL_{E,1}$ and $TL_{E,2}$ to move matched-cascode amp-cell 710 to the desired coordinates on the $G_{ma}$=6 dB arc.

An environment in which one or more embodiments described above are executed may incorporate a general-purpose computer or a special-purpose device such as a hand-held computer or communication device. Some details of such devices (e.g., processor, memory, data storage, display) may be omitted for the sake of clarity. A component such as a processor or memory to which one or more tasks or functions are attributed may be a general component temporarily configured to perform the specified task or function, or may be a specific component manufactured to perform the task or function. The term "processor" as used herein refers to one or more electronic circuits, devices, chips, processing cores and/or other components configured to process data and/or computer program code.

Data structures and program code described in this detailed description are typically stored on a non-transitory computer-readable storage medium, which may be any device or medium that can store code and/or data for use by a computer system. Non-transitory computer-readable storage media include, but are not limited to, volatile memory; non-volatile memory; electrical, magnetic, and optical storage devices such as disk drives, magnetic tape, CDs (compact discs) and DVDs (digital versatile discs or digital video discs), solid-state drives, and/or other non-transitory computer-readable media now known or later developed.

Methods and processes described in the detailed description can be embodied as code and/or data, which may be stored in a non-transitory computer-readable storage medium as described above. When a processor or computer system reads and executes the code and manipulates the data stored on the medium, the processor or computer system performs the methods and processes embodied as code and data structures and stored within the medium.

Furthermore, the methods and processes may be programmed into hardware modules such as, but not limited to, application-specific integrated circuit (ASIC) chips, field-programmable gate arrays (FPGAs), and other programmable-logic devices now known or hereafter developed. When such a hardware module is activated, it performs the methods and processes included within the module.

The foregoing embodiments have been presented for purposes of illustration and description only. They are not intended to be exhaustive or to limit this disclosure to the forms disclosed. Accordingly, many modifications and variations will be apparent to practitioners skilled in the art. The scope is defined by the appended claims, not the preceding disclosure.

Appendix A—Embedding for Maximum Output Power

To find the coordinates/location on an equi-gain arc that result in the maximum output power, the equations of T-embedding in Reference A needs to be generalized to move the amp-cell to any arbitrary coordinates in the gain-plane. Once the generalized equations are derived, one can plug in all the coordinates of an equi-gain curve, and by using the analyses described in conjunction with FIGS. 5 and 6, find the coordinates associated with the maximum output power, i.e., the maximum $G_L$. The generalized equations of T-embedding can be driven as follows. In the following equations, (H, V) can be any desired coordinates in the gain-plane, and $Z_{i,j}$ (i, j=1 or 2) are the Z-parameters of the amp-cell.

$$X_{TS} = \frac{-b \pm \sqrt{b^2 - 4ac}}{2a}, \qquad (2)$$

$$B_{TP} = (C_5 \times X_{TS} + C_6)/(C_3 \times X_{TS} + C_4)$$

where $$a = C_1 \times C_3 + C_5 \times C_7, \qquad (3)$$
$$b = C_1 \times C_4 + C_2 \times C_3 + C_5 \times C_8 + C_6 \times C_7,$$
$$c = C_2 \times C_4 + C_6 \times C_8,$$

Where $C_1 = U - H,$ $C_2 = U \times \text{Im}(Z_{12}) - V \times \text{Re}(Z_{21}) - H \times \text{Im}(Z_{21}),$ $C_3 = (H - U) \times A - V \times B,$ $C_4 = (H - U) \times \text{Im}(\Delta Z) + V \times \text{Re}(\Delta Z),$ $C_5 = -V,$ $C_6 = H - 1,$ $C_7 = (H - U) \times B + V \times A,$ $C_8 = (H - U) \times \text{Re}(\Delta Z) + V \times \text{Im}(\Delta Z),$ (4)

where $A = \text{Re}(Z_{11}) + \text{Re}(Z_{22}) - \text{Re}(Z_{12}) - \text{Re}(Z_{21}),$ $B = \text{Im}(Z_{11}) + \text{Im}(Z_{22}) - \text{Im}(Z_{12}) - \text{Im}(Z_{21}),$ $\Delta Z = Z_{11} Z_{22} - Z_{12} Z_{21}.$ (5)

What is claimed is:

1. A cascode amplifier-cell (amp-cell), comprising:
a first transistor configured in the common source (CS) amplification mode, wherein the gate terminal of the first transistor is used as the input port of the cascode amp-cell;
a second transistor configured in the common gate (CG) amplification mode, wherein the drain terminal of the second transistor is used as the output port of the cascode amp-cell;
a first inductive component coupled between the drain terminal of the first transistor and the ground to increase the impedance between the drain terminal of the first transistor and the ground, thereby increasing an output signal and a signal gain at the output port; and
a second inductive component coupled between the drain terminal of the first transistor and the source terminal of the second transistor to increase the conductance in the output admittance at the output port, thereby further increasing an output signal at the output port, wherein the second inductive component includes a first transmission line.

2. The cascode amp-cell of claim 1, wherein the first inductive component includes a first inductor implemented as a second transmission line.

3. The cascode amp-cell of claim 2, wherein the first inductive component further includes a DC-blocking capacitor coupled in series with the second transmission line.

4. The cascode amp-cell of claim 1, wherein the first inductive component is configured to resonate with a parasitic capacitance between the drain terminal of the first transistor and the ground at a millimeter-wavelength (mm-wave) frequency.

5. The cascode amp-cell of claim 1, wherein the second inductive component is configured to maximize the conductance in the output admittance at the output port.

6. The cascode amp-cell of claim 1, wherein the second inductive component is configured to increase the ratio of the resistance to the reactance in the impedance seen from the drain of the second transistor.

7. The cascode amp-cell of claim 1, wherein the first transmission line is configured to have a length between 0 and $\lambda/4$, wherein $\lambda$ is the electrical wavelength associated with an operating frequency of the cascode amp-cell.

8. The cascode amp-cell of claim 1, wherein the cascode amp-cell is configured as a power amplifier, and wherein the first inductive component and the second inductive component are configured to increase a power transfer from the first transistor to the second transistor.

9. The cascode amp-cell of claim 1, further comprising an impedance-matching circuitry coupled to the input port of the cascode amp-cell to conjugate-match a source impedance of the cascode amp-cell to a load impedance of the cascode amp-cell.

10. A power amplifier (amp), comprising:
a first transistor configured in the common source (CS) amplification mode, wherein the gate terminal of the first transistor is used as the input port of the power amp;
a second transistor configured in the common gate (CG) amplification mode, wherein the drain terminal of the second transistor is used as the output port of the power amp;
a first inductive component coupled between the drain terminal of the first transistor and the ground to increase the impedance between the drain terminal of the first transistor and the ground, thereby increasing an output power at the output port; and
a second inductive component coupled between the drain terminal of the first transistor and the source terminal of the second transistor to increase the conductance in the output admittance at the output port, thereby further increasing the output power at the output port, wherein the second inductive component includes a first transmission line.

11. The power amp of claim 10, wherein the first inductive component includes a first inductor implemented as a second transmission line.

12. The power amp of claim 11, wherein the first inductive component further includes a DC-blocking capacitor coupled in series with the second transmission line.

13. The power amp of claim 10, wherein the first inductive component is configured to resonate with a parasitic capacitance between the drain terminal of the first transistor and the ground at a millimeter-wave (mm-wave) frequency.

14. The power amp of claim 10, wherein the second inductive component is configured to maximize the conductance in the output admittance at the output port.

15. The power amp of claim 10, wherein the second inductive component is configured to increase the ratio of the resistance to the reactance in the impedance seen from the drain of the second transistor.

16. The power amp of claim 10, wherein the first transmission line is configured to have a length between 0 and $\lambda/4$, wherein $\lambda$ is the electrical wavelength associated with an operating frequency of the power amp.

17. The power amp of claim 10, wherein the first inductive component and the second inductive component are configured to increase a power transfer ratio from the first transistor to the second transistor.

18. The power amp of claim 10, further comprising an impedance-matching circuitry coupled to the input port of the power amp to conjugate-match a source impedance of the power amp to a load impedance of the power amp.

* * * * *